(12) United States Patent
Arivoli et al.

(10) Patent No.: US 7,430,215 B2
(45) Date of Patent: *Sep. 30, 2008

(54) INTERLEAVER, DEINTERLEAVER, INTERLEAVING METHOD, AND DEINTERLEAVING METHOD FOR OFDM DATA

(75) Inventors: Thangadurai Arivoli, Gandhi Nagar Madurai (IN); John D. O'Sullivan, Hunters Hill (AU)

(73) Assignee: Cisco Technology, Inc., San Jose, CA (US)

( * ) Notice: Subject to any disclaimer, the term of this patent is extended or adjusted under 35 U.S.C. 154(b) by 59 days.

This patent is subject to a terminal disclaimer.

(21) Appl. No.: 11/470,383

(22) Filed: Sep. 6, 2006

(65) Prior Publication Data

US 2007/0043982 A1    Feb. 22, 2007

Related U.S. Application Data

(63) Continuation of application No. 10/096,498, filed on Mar. 8, 2002, now Pat. No. 7,170,849.

(60) Provisional application No. 60/277,370, filed on Mar. 19, 2001, provisional application No. 60/283,609, filed on Apr. 13, 2001, provisional application No. 60/322,383, filed on Sep. 14, 2001.

(51) Int. Cl.
    H04Q 11/02    (2006.01)
(52) U.S. Cl. ............... 370/430; 370/204; 370/429; 375/223
(58) Field of Classification Search ........... 370/429, 370/463, 471, 430, 204, 412; 375/340, 250, 375/222, 223; 714/756; 708/254
See application file for complete search history.

(56) References Cited

U.S. PATENT DOCUMENTS

| | | | | |
|---|---|---|---|---|
| 5,377,133 A | | 12/1994 | Riggle et al. | 708/524 |
| 5,392,299 A | * | 2/1995 | Rhines et al. | 714/756 |
| 5,406,551 A | * | 4/1995 | Saito et al. | 370/203 |
| 5,504,775 A | * | 4/1996 | Chouly et al. | 370/210 |
| 5,537,398 A | | 7/1996 | Siwiak | 370/204 |
| 5,596,604 A | | 1/1997 | Cioffi et al. | 375/260 |
| 5,694,389 A | | 12/1997 | Seki et al. | 370/208 |
| 5,737,252 A | * | 4/1998 | Hollmann et al. | 708/254 |
| 5,771,223 A | * | 6/1998 | Kimura et al. | 370/203 |
| 5,799,033 A | * | 8/1998 | Baggen | 375/250 |
| 6,130,922 A | | 10/2000 | Stott et al. | 375/344 |
| 6,278,685 B1 | | 8/2001 | Yonge et al. | 370/203 |
| 6,396,822 B1 | * | 5/2002 | Sun et al. | 370/335 |
| 6,615,388 B1 | | 9/2003 | Takamichi | 714/795 |

(Continued)

OTHER PUBLICATIONS

Office Action for U.S. Appl. No. 11/278,239 mailed Dec. 3, 2007.

*Primary Examiner*—John Pezzlo
(74) *Attorney, Agent, or Firm*—Dov Rosenfeld; Inventek

(57) ABSTRACT

An interleaver and interleaving method each includes two stages, and is useful in coded orthogonal frequency division multiplexed (COFDM) wireless local area networks. A first stage performs a first block permutation and a second stage performs bit order permutation to effectuate a second group permutation. A corresponding de-interleaver does just the opposite at the receiver. A double-buffer version includes writing data into one memory block in a first order while reading data from the second block in a second order, with the first and second orders selected to effectuate the first block permutation.

15 Claims, 7 Drawing Sheets

U.S. PATENT DOCUMENTS

| | | | |
|---|---|---|---|
| 6,680,980 B1 | 1/2004 | Ashley et al. | 375/265 |
| 6,680,986 B1 | 1/2004 | Hemmati | 375/341 |
| 6,807,145 B1 * | 10/2004 | Weerackody et al. | 370/203 |
| 6,888,789 B1 * | 5/2005 | Sakoda et al. | 370/208 |
| 6,985,432 B1 * | 1/2006 | Hadad | 370/203 |
| 7,054,296 B1 | 5/2006 | Sorrells et al. | 370/338 |
| 2004/0240590 A1 * | 12/2004 | Cameron et al. | 375/340 |

* cited by examiner

INTERLEAVER, DEINTERLEAVER, INTERLEAVING METHOD, AND DEINTERLEAVING METHOD FOR OFDM DATA

RELATED PATENT APPLICATIONS

The present invention is a continuation of U.S. patent application Ser. No. 10/096,498 filed Mar. 8, 2002 now U.S. Pat. No. 7,170,849 to first inventor Arivoli. The contents of such U.S. patent application Ser. No. 10/096,498 are incorporated herein by reference.

U.S. patent application Ser. No. 10/096,498 claims benefit of three United States Provisional Patent Applications. The first is Ser. No. 60/277,370, filed Mar. 19, 2001, and titled SYSTEM USING SINGLE CHIP WIRELESS LAN MODEM AND SINGLE CHIP RADIO TRANSCEIVER AND APPARATI, METHODS, AND SOFTWARE PRODUCTS USED THEREIN OR THEREWITH. The second is Ser. No. 60/283,609, filed Apr. 13, 2001, and titled WIRELESS COMMUNICATION SYSTEM. The third is Ser. No. 60/322,383, filed Sep. 14, 2001, and titled INTERLEAVER AND INTERLEAVING METHOD FOR OFDM WIRELESS DATA NETWORKS. Such Provisional Patent Applications are incorporated herein by reference.

BACKGROUND OF THE INVENTION

1. Field of the Invention

The present invention relates to coded orthogonal frequency division multiplexing (COFDM), and more particularly to interleaving for wireless local area networks (WLANs) using COFDM.

2. Description of Related Art

Coded orthogonal frequency division multiplexing (COFDM) is a type of radio modulation that splits a single high-speed data stream into many much slower data streams. Each is transmitted over its own frequency-division sub-carrier and then reassembled with the others at the receiver to reconstruct the original data streams. The carriers are evenly spaced with one another, and are said to be orthogonal. Such orthogonality of the carriers greatly simplifies modulation and demodulation of so many carriers, and packs all of them together without an increase in bandwidth.

In COFDM systems, the performance and data reliability can be improved in the face of noise and other interference by spreading the data bits. In a transmitter, after encoding and prior to modulation, the coded data is "interleaved" to avoid the carrying of successive or adjacent coded bits in adjacent subcarriers. Swapping of the order of significant bits is also required so that adjacent coded bits are alternately assigned to less and more significant bits of the constellation during modulation. Thus, both interleaving of coded data and bit order mapping of the interleaved data are required.

The reverse de-interleaving operation that occurs in the receiver after demodulation also includes a bit order mapping.

A typical interleaver implementation uses a memory as a buffer. However, a design that uses a memory buffer may get clogged down with the data rates. As an example, the data rate in an IEEE 802.11a compliant system in a sixty-four-symbol quadrature amplitude modulation 64QAM) configuration can reach 72-MHz, requiring fast memory devices. Thus it is desired to reduce the data rate requirements of buffers used in a buffered interleaver.

Furthermore, it is desired to combine the interleaving or de-interleaving operation with the required bit order mapping, e.g., bit reversal needed for the modulation or demodulation process.

For more information on the IEEE 802.11 and IEEE 802.11a standards, see: ANSI/IEEE Std 802.11, 1999 Edition (ISO/IEC 8802-11:1999) Local and metropolitan area networks—Specific Requirements—Part 11: Wireless LAN Medium Access Control (MAC) and Physical Layer (PHY) Specifications, and IEEE Std 802.11a-1999 [ISO/IEC 8802-11:1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band. The standards are available on the Internet at several locations, including from the IEEE (www.IEEE.org) and in particular at http://grouper.ieee.org/groups/802/11/index.html.

SUMMARY OF THE INVENTION

One embodiment of the present invention provides an interleaver for wireless local area networks that operate with coded orthogonal frequency division multiplexing, and another embodiment provides a de-interleaver.

Furthermore, one embodiment of the present invention provides a parallel interleaver and another provides a corresponding parallel de-interleaver.

Furthermore, one embodiment of the present invention provides a RAM-module design for a parallel interleaver and corresponding de-interleaver.

Furthermore, one embodiment of the present invention provides an interleaver that achieves both symbol-wise and bit-wise interleaving effectively in one step. This can provide savings in both latency and power Briefly, an interleaver and interleaving method each includes two stages, and is useful in coded orthogonal frequency division multiplexed (COFDM) wireless local area networks. A first stage performs a first block permutation and a second stage performs bit order permutation to effectuate a second group permutation. A corresponding de-interleaver does just the opposite at the receiver. One embodiment is includes a single memory. Another embodiment includes a double-buffer and includes writing data into one memory block in a first order while reading data from the second block in a second order, with the first and second orders selected to effectuate the first block permutation.

The above and still further objects, features, and advantages of the present invention will become apparent upon consideration of the following detailed description of specific embodiments thereof, especially when taken in conjunction with the accompanying drawings.

BRIEF DESCRIPTION OF THE DRAWINGS

FIG. 3 is a functional block diagram of an interleaver architecture that uses double buffering, with one memory written into one bit at a time while the other memory block is read from.

FIG. 4 is a functional block diagram of a parallel interleaver architecture that also uses double buffering, with one memory written into more than one bit at a time while the other memory block is read from.

DETAILED DESCRIPTION

Figure 1:
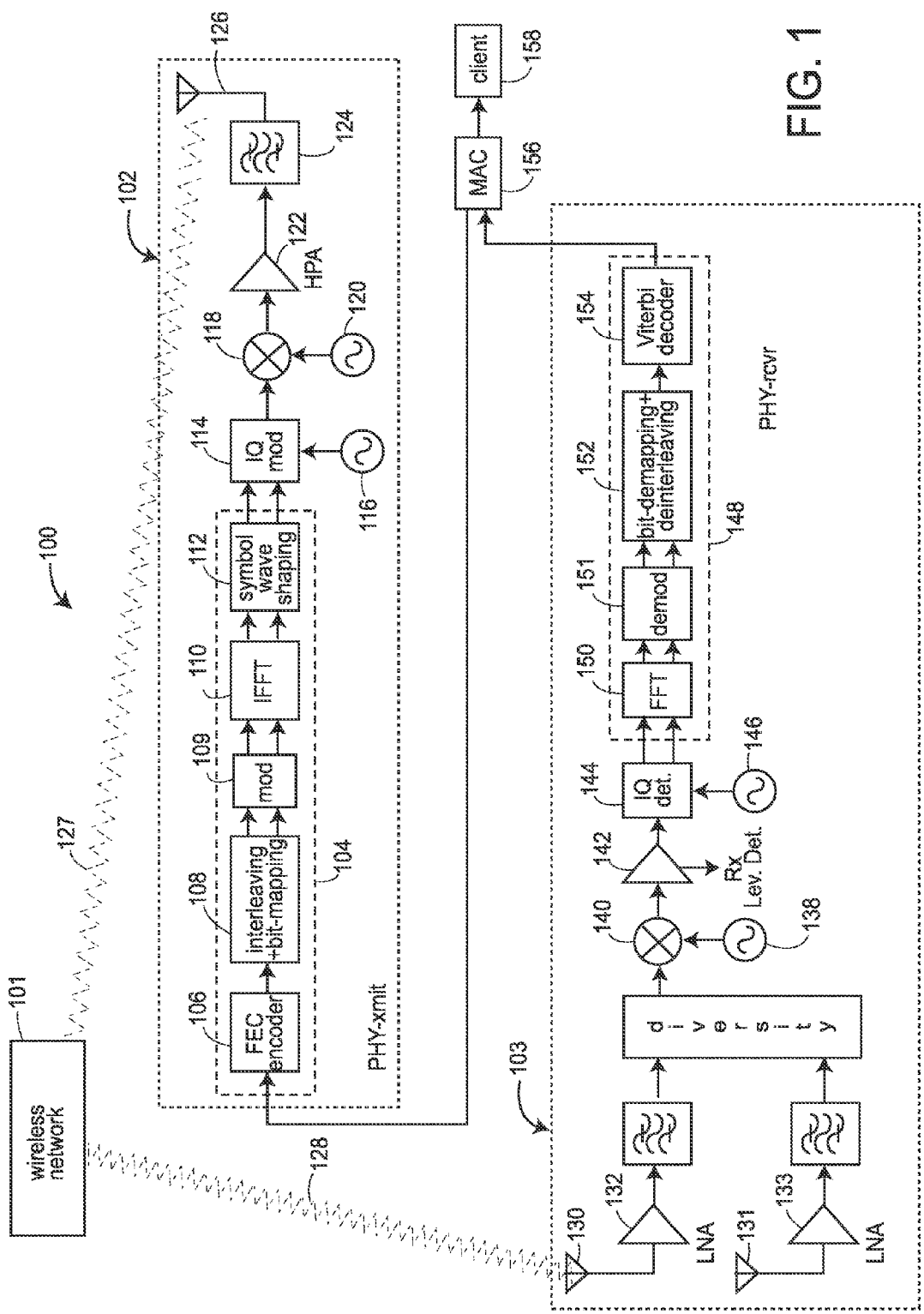
FIG. 1 is a functional block diagram of a wireless local area network (LAN) system embodiment of the present invention.

FIG. 1 illustrates a wireless local area network (LAN) system embodiment of the present invention, referred to herein by the general reference numeral 100. Such is preferably based on orthogonal frequency division multiplexing (OFDM), and modulation, e.g., quadrature phase shift keying (QPSK) or binary phase shift keying (BPSK) or quadrature amplitude modulation (QAM) of signals transmitted in the 5 GHz frequency spectrum. The wireless LAN system 100 includes a wireless network 101 connected to the Internet, a PHY-transmitter 102, and a PHY-receiver 103. Such all preferably conform to the IEEE-802.11a specification for a physical layer (PHY) interface in a wireless local area network which allows clients to communicate in an ad-hoc or infra-structure LAN.

In a typical embodiment, the transmitter 102 comprises one or more digital signal processing elements (DSP) 104 which implement a forward error correction (FEC) encoder 106, an interleaver and bit order mapping unit to interleave and perform bit-order mapping of the coded data 108, a modulator 109, an inverse discrete Fourier transform (IFFT) processor 110, and a symbol wave shaper 112. The DSP 104 outputs in-phase (I) and quadrature-phase (Q) signals that are input to an I/Q modulator 114 driven by a local oscillator 116. The modulated output is sent to a mixer 118 for up-conversion to the 5 GHz band. A second local oscillator 120 provides the necessary carrier frequency. A high power amplifier (HPA) 122 has any spurious sidebands removed by a multi-pole filter 124 before being output to a transmitter antenna 126. A radio up-link 127 is received by the wireless network 101, and communicates Internet traffic, for example.

The receiver 103 receives a radio down-link 128 that is typically transmitted in bursts. Each burst is begun with a training sequence, e.g., a short and long preamble. In one embodiment, the receiver 103 includes at least two receiver antennas 130 and 131 each followed by a low-noise amplifier (LNA) 132 and 133. The antennas are physically separated and operated to take advantage of diversity.

A local oscillator 138 and a first mixer 140 produce an intermediate frequency (IF). A variable gain amplifier 142 amplifies the IF. A second local oscillator 146 provides the carrier necessary to derive I and Q samples. Automatic frequency control (AFC) clock recovery can be skipped if frequency offset errors are corrected in later digital processing.

A set of digital processing elements (receiver-DSP) 148 implement a discrete Fourier transform (FFT) process 150, a demodulator 151, a de-interleaver 152 that in one embodiment also includes any required bit order mapping, and an FEC decoder 154 that in one embodiment is a Viterbi decoder that accepts a number of soft bits per data bit to be decoded. The receiver-DSP 148 further includes the necessary digital logic needed for carrier frequency offset determination and correction. The higher levels of a mobile, computer-network client are represented by a media access controller (MAC) 156 and a client agent software 158.

One embodiment of interleaver 108 and one embodiment of de-interleaver 152 can each also carry out any of the bit-order mapping operations such as bit reversals that are needed to convert the order of the bits in the forward or inverse FFT operation to or from natural order.

Embodiments of interleaver 108 and of de-interleaver 152 that carry out the interleaving and de-interleaving for signals conforming to the IEEE 802.11a standard can carry out the interleaving (and its reverse) as described in Section 17.3.5.6 of the document defining the physical layer of the ANSI/IEEE Std 802.11a, 1999 Edition. The Document is "IEEE Std 802.11a-1999 (ISO/IEC 8802-11:1999/Amd 1:2000(E)] (Supplement to IEEE Std 802.11, 1999 Edition) Part 11: Wireless LAN Medium Access Control (MAC) and Physical Layer (PHY) specifications: High-speed Physical Layer in the 5 GHz Band." Such document is incorporated herein by reference.

Implementations typically use digital memory devices, and conventional designs get clogged with high data rates that can reach 72-MHz in a sixty-four symbol quadrature amplitude modulation (64QAM) configuration that is compliant with the IEEE 802.11a standard. In one embodiment, interleaver 108 and de-interleaver 152 reduce the peak data rates at any one memory access point by using multiple memory banks and bits.

The Interleaver and De-Interleaver

One embodiment of the interleaver performs two permutations on blocks of input bits. Each block includes the encoded bits that are used to generate a single OFDM symbol. Thus, each block includes the number of bits per symbol.

The first permutation maps adjacent coded bits to non-adjacent subcarriers. The second rotates the assignment of bits to the modulator such that successive input coded bits are mapped to less significant or more significant bits of the modulation constellation, thereby avoiding clusters of low-reliability bits at the decoder input of a corresponding receiver, e.g., a Viterbi soft-decision decoder's input. A corresponding de-interleaver does just the opposite at the receiver.

How well interleaving improves communication is determined in part by the subcarrier separation for successive coded bits and this should be as large as possible, e.g., to minimize the correlation of fading or dropouts for successive bits. As used herein, "compatible-mode" refers to IEEE-802.11a standard rates and the supported modulation schemes of those rates. The embodiments described in detail herein work in such a compatible mode. In alternate embodiments of the interleaver, the embodiments described herein can be modified to operate in non-compatible modes that may provide a higher data bit rate.

In some embodiments, the processing latency requirements restrict the length of the interleaver to a single OFDM frame. Interleaving over multiple frames could improve the performance in channels subject to fading but will introduce additional latency or delay in processing a received packet. Furthermore, interleaving over multiple frames may lead to non-conformance to the IEEE 802.11a standard.

Interleaver Functions

Figure 2:
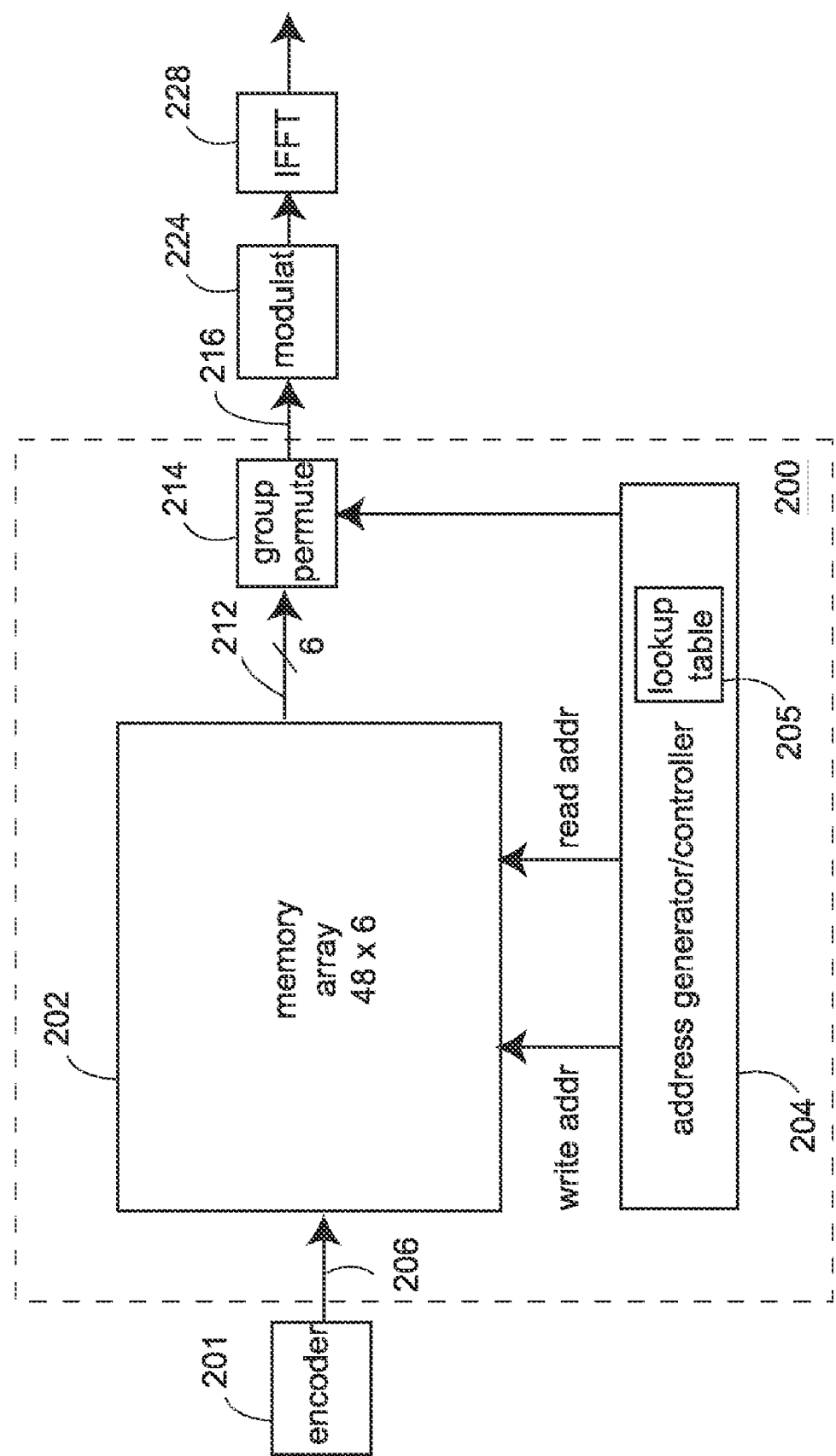
FIG. 2 is a functional block diagram of a one memory block interleaver that implements the block and group permutations for interleaving, and is similar to the interleaver and de-interleaver shown in FIG. 1.

FIG. 2 shows one interleaver embodiment 200 that includes a memory 202. An input 206 is in the form of blocks of coded bit data, e.g., from an encoder 201 of a transmit signal processor. The output 216 of the interleaver 200 is in the form of subcarriers (also called groups) of data. In a typical COFDM transmitter, the subcarrier data is modulated, e.g., in a modulator shown as 224, and the modulated data is inverse discrete Fourier transformed in an inverse Fast Fourier transform (IFFT) unit shown as 228.

The bits of a block from the encoder are written into the memory 202, and then the bits of that block are read out as data 212 in a different order. The organization of the bits in the memory 202 may be described by an array of rows and columns, called the "interleaver array" herein, that can describe the order in which the bits of a block are written into and the order in which the bits are read out from the array. Such orders of reading and writing are controlled by an address generator/controller 204 that provides the write and read addresses as shown in FIG. 2.

For some data rates, e.g., those that are modulated by a QAM scheme such as 64QAM and 16QAM, the data that is read out of the memory undergoes a bit order permutation in bit permuter 214, as described further below.

FIG. 2 describes an interleaver embodiment. A de-interleaver may also be constructed using a memory such as memory 202. The ordering for a de-interleaver is typically the reverse of that of an interleaver i.e., the write order for an interleaver defines the read order for a de-interleaver, and vice-versa. While one skilled in the art will readily be able to design a de-interleaver from the descriptions herein of interleaver embodiments, some de-interleaver embodiments will be described more fully below.

Table 1 defines the parameters of one interleaver embodiment for IEEE 802.11a compatible interleaving operation. The table states, for example, that the interleaver array for 64QAM IEEE compatible operation has 288 bits arranged as 16 rows of 18 column elements. The output bits are grouped into groups of bits on read out before presentation to the modulator (in the case of an interleaver) or that arrive at a de-interleaver (in the case of a de-interleaver). Each group corresponds to a subcarrier. As can be seen, each row is divided into three subcarriers (groups), independent of the type of modulation. In one embodiment, there are 16 rows in each array, also independent of the modulation type. The number of bits in each subcarrier presented to the next block in the transmit chain varies from 1-bit to 6-bits, depending on the modulation. For example, for 64QAM each subcarrier, i.e., each group, has 6-bits. The number of bits per subcarrier is denoted by $N_{BPSC}$ herein, and the number of coded bits per symbol is denoted by $N_{CBPS}$. Each interleaver array includes 48 groups for IEEE 802.11a compatible operation, i.e., $N_{CBPS}=48\ N_{BPSC}$ in compatible mode. Other embodiments may contain a different number of groups in each array.

TABLE 1

Block interleaver parameters for compatible operation

| Modulation | Block size $N_{CBPS}$(bits) | Rows | Colmns | Group size $N_{BPSC}$(bits) | Groups per row |
|---|---|---|---|---|---|
| BPSK | 48 | 16 | 3 | 1 | 3 |
| QPSK | 96 | 16 | 6 | 2 | 3 |
| 8PSK | 144 | 16 | 9 | 3 | 3 |
| 16QAM | 192 | 16 | 12 | 4 | 3 |
| 64QAM | 288 | 16 | 18 | 6 | 3 |

The Block Permutation

In interleaving for OFDM, the first permutation is used for all modulation types and maps adjacent coded bits to non-adjacent OFDM symbol sub-carriers or tones. In one embodiment, it is performed on the complete block of bits that is used to generate an OFDM symbol and includes writing the input data stream into the memory 202 and then reading the data out of the memory 202 in a different order.

The ordering of the reading and writing operations may be understood with reference to Tables 2-7 for some of the compatible data rates. These show the interleaver arrays of data bits for IEEE 802.11a compatible operation and indicate the order in which the bits are written into and read from the memory 202. The tables also show the de-interleaver array write and read ordering. Note that de-interleaver write order is the same as interleaver read order, and de-interleaver read order is the same as interleaver write order.

Tables 2-7 also indicate the grouping of bits on read out before presentation to the modulator (in the case of an interleaver) or that are presented to a de-interleaver.

TABLE 2

64QAM: Interleaver Array Write Order, De-interleaver Array Read Order

| | | Column | | | | | | | | | | | | | | | | | |
|---|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 | 16 | 17 |
| Row | 0 | 0 | 16 | 32 | 48 | 64 | 80 | 96 | 112 | 128 | 144 | 160 | 176 | 192 | 208 | 224 | 240 | 256 | 272 |
| | 1 | 1 | 17 | 33 | 49 | 65 | 81 | 97 | 113 | 129 | 145 | 161 | 177 | 193 | 209 | 225 | 241 | 257 | 273 |
| | 2 | 2 | 18 | 34 | 50 | 66 | 82 | 98 | 114 | 130 | 146 | 162 | 178 | 194 | 210 | 226 | 242 | 258 | 274 |
| | 3 | 3 | 19 | 35 | 51 | 67 | 83 | 99 | 115 | 131 | 147 | 163 | 179 | 195 | 211 | 227 | 243 | 259 | 275 |
| | 4 | 4 | 20 | 36 | 52 | 68 | 84 | 100 | 116 | 132 | 148 | 164 | 180 | 196 | 212 | 228 | 244 | 260 | 276 |
| | 5 | 5 | 21 | 37 | 53 | 69 | 85 | 101 | 117 | 133 | 149 | 165 | 181 | 197 | 213 | 229 | 245 | 261 | 277 |
| | 6 | 6 | 22 | 38 | 54 | 70 | 86 | 102 | 118 | 134 | 150 | 166 | 182 | 198 | 214 | 230 | 246 | 262 | 278 |
| | 7 | 7 | 23 | 39 | 55 | 71 | 87 | 103 | 119 | 135 | 151 | 167 | 183 | 199 | 215 | 231 | 247 | 263 | 279 |
| | 8 | 8 | 24 | 40 | 56 | 72 | 88 | 104 | 120 | 136 | 152 | 168 | 184 | 200 | 216 | 232 | 248 | 264 | 280 |
| | 9 | 9 | 25 | 41 | 57 | 73 | 89 | 105 | 121 | 137 | 153 | 169 | 185 | 201 | 217 | 233 | 249 | 265 | 281 |
| | 10 | 10 | 26 | 42 | 58 | 74 | 90 | 106 | 122 | 138 | 154 | 170 | 186 | 202 | 218 | 234 | 250 | 266 | 282 |
| | 11 | 11 | 27 | 43 | 59 | 75 | 91 | 107 | 123 | 139 | 155 | 171 | 187 | 203 | 219 | 235 | 251 | 267 | 283 |
| | 12 | 12 | 28 | 44 | 60 | 76 | 92 | 108 | 124 | 140 | 156 | 172 | 188 | 204 | 220 | 236 | 252 | 268 | 284 |
| | 13 | 13 | 29 | 45 | 61 | 77 | 93 | 109 | 125 | 141 | 157 | 173 | 189 | 205 | 221 | 237 | 253 | 269 | 285 |
| | 14 | 14 | 30 | 46 | 62 | 78 | 94 | 110 | 126 | 142 | 158 | 174 | 190 | 206 | 222 | 238 | 254 | 270 | 286 |
| | 15 | 15 | 31 | 47 | 63 | 79 | 95 | 111 | 127 | 143 | 159 | 175 | 191 | 207 | 223 | 239 | 255 | 271 | 287 |
| | | 0 | | | | | | 1 | | | | | | 2 | | | | | |
| | | Group | | | | | | | | | | | | | | | | | |

In one embodiment, data bits are written column by column of the interleaver array and are read row by row. The ordering of the writing in the case of the interleaver is denoted by the index k, where k indexes up to the number of coded bits per symbol.

If the index of the input coded bits is denoted by k, $k=0, 1, \ldots, N_{CBPS}-1$, the operation can be summarized by a set of equations on the index.

$$i = (N_{CBPS}/16)(k \bmod 16) + \mathrm{floor}(k/16)$$

$$= (3 N_{BPSC})(k \bmod 16) + \mathrm{floor}(k/16)$$

TABLE 3

64QAM: Interleaver Array Read Order, De-interleaver Array Write Order

| | | Column | | | | | | | | | | | | | | | | | |
|---|---|---|---|---|---|---|---|---|---|---|---|---|---|---|---|---|---|---|---|
| | | 0 | 1 | 2 | 3 | 4 | 5 | 6 | 7 | 8 | 9 | 10 | 11 | 12 | 13 | 14 | 15 | 16 | 17 |
| Row | 0 | 0 | 1 | 2 | 3 | 4 | 5 | 6 | 7 | 8 | 9 | 10 | 11 | 12 | 13 | 14 | 15 | 16 | 17 |
| | 1 | 18 | 19 | 20 | 21 | 22 | 23 | 24 | 25 | 26 | 27 | 28 | 29 | 30 | 31 | 32 | 33 | 34 | 35 |
| | 2 | 36 | 37 | 38 | 39 | 40 | 41 | 42 | 43 | 44 | 45 | 46 | 47 | 48 | 49 | 50 | 51 | 52 | 53 |
| | 3 | 54 | 55 | 56 | 57 | 58 | 59 | 60 | 61 | 62 | 63 | 64 | 65 | 66 | 67 | 68 | 69 | 70 | 71 |
| | 4 | 72 | 73 | 74 | 75 | 76 | 77 | 78 | 79 | 80 | 81 | 82 | 83 | 84 | 85 | 86 | 87 | 88 | 89 |
| | 5 | 90 | 91 | 92 | 93 | 94 | 95 | 96 | 97 | 98 | 99 | 100 | 101 | 102 | 103 | 104 | 105 | 106 | 107 |
| | 6 | 108 | 109 | 110 | 111 | 112 | 113 | 114 | 115 | 116 | 117 | 118 | 119 | 120 | 121 | 122 | 123 | 124 | 125 |
| | 7 | 126 | 127 | 128 | 129 | 130 | 131 | 132 | 133 | 134 | 135 | 136 | 137 | 138 | 139 | 140 | 141 | 142 | 143 |
| | 8 | 144 | 145 | 146 | 147 | 148 | 149 | 150 | 151 | 152 | 153 | 154 | 155 | 156 | 157 | 158 | 159 | 160 | 161 |
| | 9 | 162 | 163 | 164 | 165 | 166 | 167 | 168 | 169 | 170 | 171 | 172 | 173 | 174 | 175 | 176 | 177 | 178 | 179 |
| | 10 | 180 | 181 | 182 | 183 | 184 | 185 | 186 | 187 | 188 | 189 | 190 | 191 | 192 | 193 | 194 | 195 | 196 | 197 |
| | 11 | 198 | 199 | 200 | 201 | 202 | 203 | 204 | 205 | 206 | 207 | 208 | 209 | 210 | 211 | 212 | 213 | 214 | 215 |
| | 12 | 216 | 217 | 218 | 219 | 220 | 221 | 222 | 223 | 224 | 225 | 226 | 227 | 228 | 229 | 230 | 231 | 232 | 233 |
| | 13 | 234 | 235 | 236 | 237 | 238 | 239 | 240 | 241 | 242 | 243 | 244 | 245 | 246 | 247 | 248 | 249 | 250 | 251 |
| | 14 | 252 | 253 | 254 | 255 | 256 | 257 | 258 | 259 | 260 | 261 | 262 | 263 | 264 | 265 | 266 | 267 | 268 | 269 |
| | 15 | 270 | 271 | 272 | 273 | 274 | 275 | 276 | 277 | 278 | 279 | 280 | 281 | 282 | 283 | 284 | 285 | 286 | 287 |
| | | 0 | | | | | | 1 | | | | | | 2 | | | | | |
| | | Group | | | | | | | | | | | | | | | | | |

TABLE 4

16QAM: Interleaver Array Write Order, De-interleaver Array Read Order

|  | Column |  |  |  |  |  |  |  |  |  |  |  |
|---|---|---|---|---|---|---|---|---|---|---|---|---|
| Row | 0 | 1 | 2 | 3 | 4 | 5 | 6 | 7 | 8 | 9 | 10 | 11 |
| 0 | 0 | 16 | 32 | 48 | 64 | 80 | 96 | 112 | 128 | 144 | 160 | 176 |
| 1 | 1 | 17 | 33 | 49 | 65 | 81 | 97 | 113 | 129 | 145 | 161 | 177 |
| 2 | 2 | 18 | 34 | 50 | 66 | 82 | 98 | 114 | 130 | 146 | 162 | 178 |
| 3 | 3 | 19 | 35 | 51 | 67 | 83 | 99 | 115 | 131 | 147 | 163 | 179 |
| 4 | 4 | 20 | 36 | 52 | 68 | 84 | 100 | 116 | 132 | 148 | 164 | 180 |
| 5 | 5 | 21 | 37 | 53 | 69 | 85 | 101 | 117 | 133 | 149 | 165 | 181 |
| 6 | 6 | 22 | 38 | 54 | 70 | 86 | 102 | 118 | 134 | 150 | 166 | 182 |
| 7 | 7 | 23 | 39 | 55 | 71 | 87 | 103 | 119 | 135 | 151 | 167 | 183 |
| 8 | 8 | 24 | 40 | 56 | 72 | 88 | 104 | 120 | 136 | 152 | 168 | 184 |
| 9 | 9 | 25 | 41 | 57 | 73 | 89 | 105 | 121 | 137 | 153 | 169 | 185 |
| 10 | 10 | 26 | 42 | 58 | 74 | 90 | 106 | 122 | 138 | 154 | 170 | 186 |
| 11 | 11 | 27 | 43 | 59 | 75 | 91 | 107 | 123 | 139 | 155 | 171 | 187 |
| 12 | 12 | 28 | 44 | 60 | 76 | 92 | 108 | 124 | 140 | 156 | 172 | 188 |
| 13 | 13 | 29 | 45 | 61 | 77 | 93 | 109 | 125 | 141 | 157 | 173 | 189 |
| 14 | 14 | 30 | 46 | 62 | 78 | 94 | 110 | 126 | 142 | 158 | 174 | 190 |
| 15 | 15 | 31 | 47 | 63 | 79 | 95 | 111 | 127 | 143 | 159 | 175 | 191 |
| Group | 0 | | | | 1 | | | | 2 | | | |

TABLE 5

16QAM: Interleaver Array Read Order, De-interleaver Array Write Order

|  | Column |  |  |  |  |  |  |  |  |  |  |  |
|---|---|---|---|---|---|---|---|---|---|---|---|---|
| Row | 0 | 1 | 2 | 3 | 4 | 5 | 6 | 7 | 8 | 9 | 10 | 11 |
| 0 | 0 | 1 | 2 | 3 | 4 | 5 | 6 | 7 | 8 | 9 | 10 | 11 |
| 1 | 12 | 13 | 14 | 15 | 16 | 17 | 18 | 19 | 20 | 21 | 22 | 23 |
| 2 | 24 | 25 | 26 | 27 | 28 | 29 | 30 | 31 | 32 | 33 | 34 | 35 |
| 3 | 36 | 37 | 38 | 39 | 40 | 41 | 42 | 43 | 44 | 45 | 46 | 47 |
| 4 | 48 | 49 | 50 | 51 | 52 | 53 | 54 | 55 | 56 | 57 | 58 | 59 |
| 5 | 60 | 61 | 62 | 63 | 64 | 65 | 66 | 67 | 68 | 69 | 70 | 71 |
| 6 | 72 | 73 | 74 | 75 | 76 | 77 | 78 | 79 | 80 | 81 | 82 | 83 |
| 7 | 84 | 85 | 86 | 87 | 88 | 89 | 90 | 91 | 92 | 93 | 94 | 95 |
| 8 | 96 | 97 | 98 | 99 | 100 | 101 | 102 | 103 | 104 | 105 | 106 | 107 |
| 9 | 108 | 109 | 110 | 111 | 112 | 113 | 114 | 115 | 116 | 117 | 118 | 119 |
| 10 | 120 | 121 | 122 | 123 | 124 | 125 | 126 | 127 | 128 | 129 | 130 | 131 |
| 11 | 132 | 133 | 134 | 135 | 136 | 137 | 138 | 139 | 140 | 141 | 142 | 143 |
| 12 | 144 | 145 | 146 | 147 | 148 | 149 | 150 | 151 | 152 | 153 | 154 | 155 |
| 13 | 156 | 157 | 158 | 159 | 160 | 161 | 162 | 163 | 164 | 165 | 166 | 167 |
| 14 | 168 | 169 | 170 | 171 | 172 | 173 | 174 | 175 | 176 | 177 | 178 | 179 |
| 15 | 180 | 181 | 182 | 183 | 184 | 185 | 186 | 187 | 188 | 189 | 190 | 191 |
| Group | 0 | | | | 1 | | | | 2 | | | |

TABLE 6

8PSK, QPSK, and BPSK: Interleaver Array Write Order, De-interleaver Array Read Order

| | 8PSK | | | | | | | | | | QPSK | | | | | | | BPSK | | |
|---|---|---|---|---|---|---|---|---|---|---|---|---|---|---|---|---|---|---|---|---|
| | Column | | | | | | | | | | Column | | | | | | | Column | | |
| Row | 0 | 1 | 2 | 3 | 4 | 5 | 6 | 7 | 8 | | 0 | 1 | 2 | 3 | 4 | 5 | | 0 | 1 | 2 |
| 0 | 0 | 16 | 32 | 48 | 64 | 80 | 96 | 112 | 128 | | 0 | 16 | 32 | 48 | 64 | 80 | | 0 | 16 | 32 |
| 1 | 1 | 17 | 33 | 49 | 65 | 81 | 97 | 113 | 129 | | 1 | 17 | 33 | 49 | 65 | 81 | | 1 | 17 | 33 |
| 2 | 2 | 18 | 34 | 50 | 66 | 82 | 98 | 114 | 130 | | 2 | 18 | 34 | 50 | 66 | 82 | | 2 | 18 | 34 |
| 3 | 3 | 19 | 35 | 51 | 67 | 83 | 99 | 115 | 131 | | 3 | 19 | 35 | 51 | 67 | 83 | | 3 | 19 | 35 |
| 4 | 4 | 20 | 36 | 52 | 68 | 84 | 100 | 116 | 132 | | 4 | 20 | 36 | 52 | 68 | 84 | | 4 | 20 | 36 |
| 5 | 5 | 21 | 37 | 53 | 69 | 85 | 101 | 117 | 133 | | 5 | 21 | 37 | 53 | 69 | 85 | | 5 | 21 | 37 |
| 6 | 6 | 22 | 38 | 54 | 70 | 86 | 102 | 118 | 134 | | 6 | 22 | 38 | 54 | 70 | 86 | | 6 | 22 | 38 |
| 7 | 7 | 23 | 39 | 55 | 71 | 87 | 103 | 119 | 135 | | 7 | 23 | 39 | 55 | 71 | 87 | | 7 | 23 | 39 |
| 8 | 8 | 24 | 40 | 56 | 72 | 88 | 104 | 120 | 136 | | 8 | 24 | 40 | 56 | 72 | 88 | | 8 | 24 | 40 |
| 9 | 9 | 25 | 41 | 57 | 73 | 89 | 105 | 121 | 137 | | 9 | 25 | 41 | 57 | 73 | 89 | | 9 | 25 | 41 |
| 10 | 10 | 26 | 42 | 58 | 74 | 90 | 106 | 122 | 138 | | 10 | 26 | 42 | 58 | 74 | 90 | | 10 | 26 | 42 |
| 11 | 11 | 27 | 43 | 59 | 75 | 91 | 107 | 123 | 139 | | 11 | 27 | 43 | 59 | 75 | 91 | | 11 | 27 | 43 |
| 12 | 12 | 28 | 44 | 60 | 76 | 92 | 108 | 124 | 140 | | 12 | 28 | 44 | 60 | 76 | 92 | | 12 | 28 | 44 |
| 13 | 13 | 29 | 45 | 61 | 77 | 93 | 109 | 125 | 141 | | 13 | 29 | 45 | 61 | 77 | 93 | | 13 | 29 | 45 |
| 14 | 14 | 30 | 46 | 62 | 78 | 94 | 110 | 126 | 142 | | 14 | 30 | 46 | 62 | 78 | 94 | | 14 | 30 | 46 |
| 15 | 15 | 31 | 47 | 63 | 79 | 95 | 111 | 127 | 143 | | 15 | 31 | 47 | 63 | 79 | 95 | | 15 | 31 | 47 |
| Group | 0 | | | 1 | | | 2 | | | | 0 | | 1 | | 2 | | | 0 | 1 | 2 |

TABLE 7

8PSK, QPSK, BPSK: Interleaver Array Read Order, De-interleaver Array Write Order

| | | 8PSK Column | | | | | | | | | QPSK Column | | | | | | BPSK Column | | |
|---|---|---|---|---|---|---|---|---|---|---|---|---|---|---|---|---|---|---|---|
| | | 0 | 1 | 2 | 3 | 4 | 5 | 6 | 7 | 8 | 0 | 1 | 2 | 3 | 4 | 5 | 0 | 1 | 2 |
| Row | 0 | 0 | 1 | 2 | 3 | 4 | 5 | 6 | 7 | 8 | 0 | 1 | 2 | 3 | 4 | 5 | 0 | 1 | 2 |
| | 1 | 9 | 10 | 11 | 12 | 13 | 14 | 15 | 16 | 17 | 6 | 7 | 8 | 9 | 10 | 11 | 3 | 4 | 5 |
| | 2 | 18 | 19 | 20 | 21 | 22 | 23 | 24 | 25 | 26 | 12 | 13 | 14 | 15 | 16 | 17 | 6 | 7 | 8 |
| | 3 | 27 | 28 | 29 | 30 | 31 | 32 | 33 | 34 | 35 | 18 | 19 | 20 | 21 | 22 | 23 | 9 | 10 | 11 |
| | 4 | 36 | 37 | 38 | 39 | 40 | 41 | 42 | 43 | 44 | 24 | 25 | 26 | 27 | 28 | 29 | 12 | 13 | 14 |
| | 5 | 45 | 46 | 47 | 48 | 49 | 50 | 51 | 52 | 53 | 30 | 31 | 32 | 33 | 34 | 35 | 15 | 16 | 17 |
| | 6 | 54 | 55 | 56 | 57 | 58 | 59 | 60 | 61 | 62 | 36 | 37 | 38 | 39 | 40 | 41 | 18 | 19 | 20 |
| | 7 | 63 | 64 | 65 | 66 | 67 | 68 | 69 | 70 | 71 | 42 | 43 | 44 | 45 | 46 | 47 | 21 | 22 | 23 |
| | 8 | 72 | 73 | 74 | 75 | 76 | 77 | 78 | 79 | 80 | 48 | 49 | 50 | 51 | 52 | 53 | 24 | 25 | 26 |
| | 9 | 81 | 82 | 83 | 84 | 85 | 86 | 87 | 88 | 89 | 54 | 55 | 56 | 57 | 58 | 59 | 27 | 28 | 29 |
| | 10 | 90 | 91 | 92 | 93 | 94 | 95 | 96 | 97 | 98 | 60 | 61 | 62 | 63 | 64 | 65 | 30 | 31 | 32 |
| | 11 | 99 | 100 | 101 | 102 | 103 | 104 | 105 | 106 | 107 | 66 | 67 | 68 | 69 | 70 | 71 | 33 | 34 | 35 |
| | 12 | 108 | 109 | 110 | 111 | 112 | 113 | 114 | 115 | 116 | 72 | 73 | 74 | 75 | 76 | 77 | 36 | 37 | 38 |
| | 13 | 117 | 118 | 119 | 120 | 121 | 122 | 123 | 124 | 125 | 78 | 79 | 80 | 81 | 82 | 83 | 39 | 40 | 41 |
| | 14 | 126 | 127 | 128 | 129 | 130 | 131 | 132 | 133 | 134 | 84 | 85 | 86 | 87 | 88 | 89 | 42 | 43 | 44 |
| | 15 | 135 | 136 | 137 | 138 | 139 | 140 | 141 | 142 | 143 | 90 | 91 | 92 | 93 | 94 | 95 | 45 | 46 | 47 |
| | | 0 | | | 1 | | | 2 | | | 0 | | | 1 | | 2 | 0 | 1 | 2 |
| | | Group | | | | | | | | | Group | | | | | | Group | | |

In the embodiment of FIG. 2, the data is read out in an order determined in the address generator 204. In one embodiment, a lookup table 205 determines the order. For compatible mode, the memory array 202 stores 48*6 bits.

Parallel Interleaver

Figure 3:
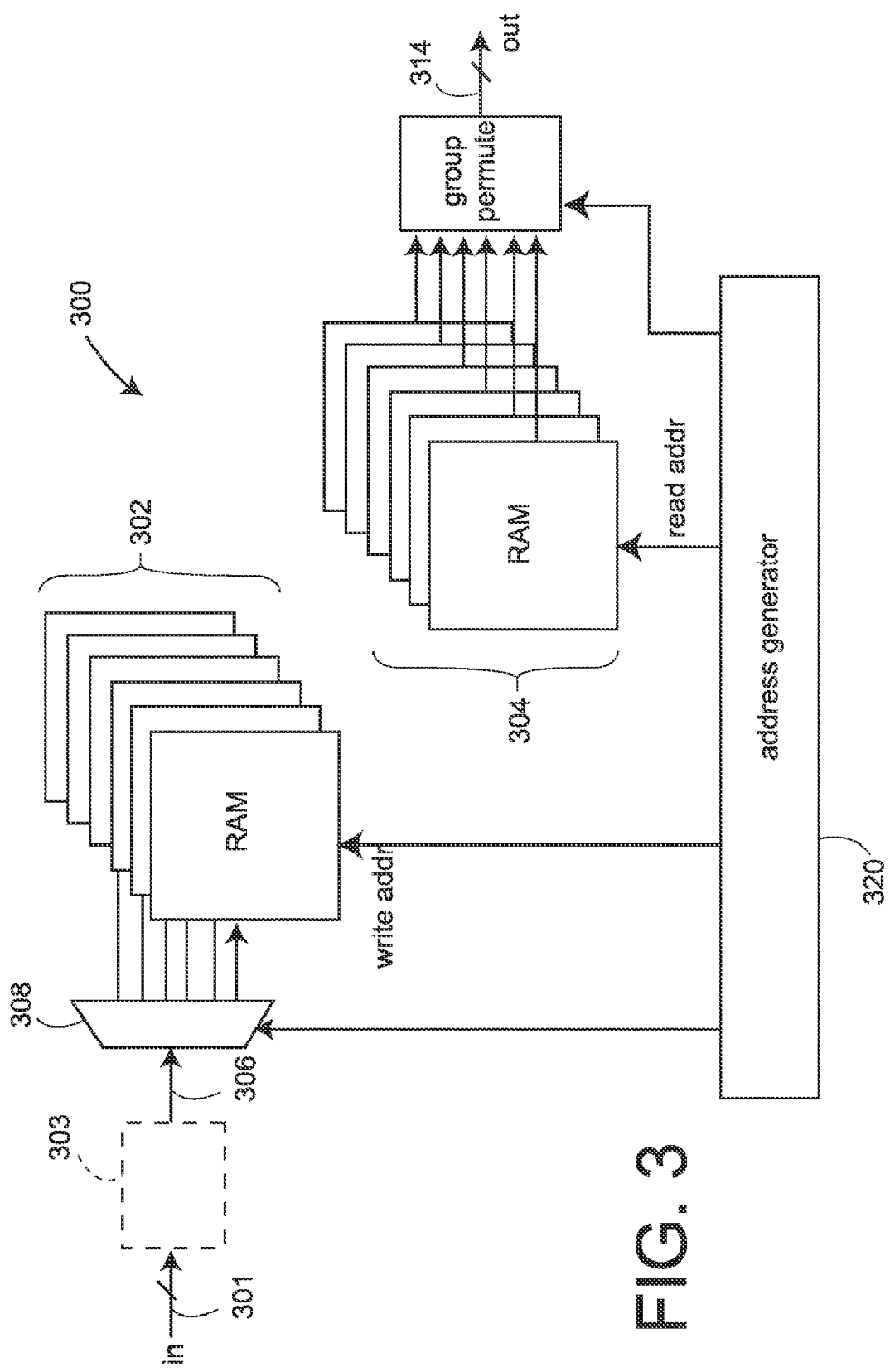

FIG. 3 illustrates one embodiment of a parallel interleaver 300 for carrying out the interleaving operations. The interleaver 300 includes a first memory block 302 and a second memory block 304. Each memory block can store the bits of one symbol as one interleaver array. While one array is written into one memory block, e.g., block 302, the other, the array in the other previously written-to memory block, e.g., memory block 304 is read. The memories are then swapped for the next frame. Latency is therefore not less than the time taken to read a complete block of data into RAM.

In one embodiment, each memory block is arranged as a number of memories, which in one embodiment may be a number of discrete random access memories (RAMs). An input data, e.g., in the form of an input data bus 306, is switched through to the appropriate RAMs in the first memory bank 302 by a de-multiplexer switch 308.

The interleaver outputs as signal 314 $N_{BPSC}$ bits per subcarrier to the modulator and IFFT unit. In one embodiment of the transceiver, the IFFT requires data at an input rate of 20 MHz in compatible-mode. Not all IFFT subcarriers are assigned bits, e.g., the missing zero frequency subcarrier and frequency guard-band subcarriers and pilot subcarriers. A zero output enable in the interleaver output addressing could be used to indicate which are carriers with no data In practical implementations, the interleaver peak output rate is about twenty Msymbols/s for compatible rate.

In the embodiment shown in FIG. 3, the input 306 is written into the memory array one bit at a time, and some encoders provide coded data, e.g., data 306 one bit at a time. Another embodiment of the encoder provides more than one bit of coded data at a time. This is shown as data 301 that in one embodiment, is 2-bits, i.e., one di-bit at a time. In such a case, the interleaver 300 also includes a parallel-to-serial converter 303 to convert the di-bits into a serial bit stream. The maximum interleaver bit rate throughput is the coded bit rate, e.g., 72-Mbps for 64QAM. Thus, in such an embodiment the peak memory rate for the fastest compatible mode is 72-Mbps for 64QAM, which is relatively high.

The embodiment 300 also includes a group bit-permute unit that is required for some modulation schemes and data rates, and an address generator/controller 320.

Figure 4:
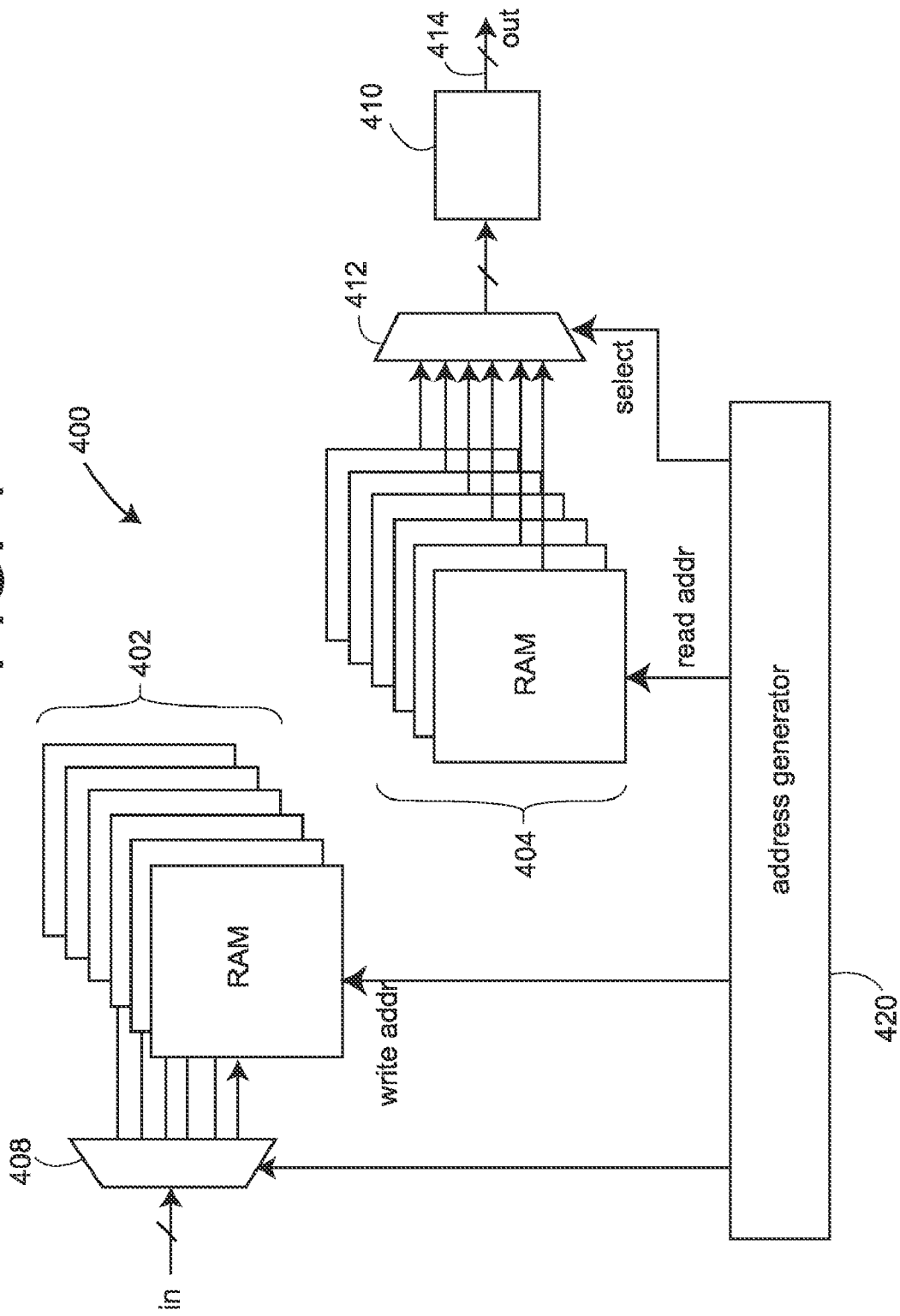

FIG. 4 shown another embodiment 400 of a parallel interleaver that accepts data from an encoder more than one bit at a time, e.g., one di-bit at a time. In this embodiment, the input data is directly written into the memory 402 at the input rate, e.g., one di-bit at a time. Writing one di-bit at a time reduces the memory bandwidth requirement of a two stage buffered interleaver by a factor of two, e.g., to a maximum of 36 Mbps for 64QAM. Other implementations may include an encoder that provides more than two bits at a time and an interleaver that includes a memory that is read into than two bits at a time.

The two bits at a time are written into memory 402 that will contain two interleaver arrays, i.e., two symbols, while one bit from each of the written two-bits in the second memory array 404 is selected by a multiplexer switch—a selector—412. The selected one-symbol of the multiplexer output is sent to the output bus 414 through a group permute unit 410 that may be needed for some modulation schemes as described below. In the one-bit written at a time embodiment of FIG. 3, no multiplexer is required at the output.

Unit 408 is a de-multiplexer to divide the incoming data into the discrete number of RAMs in each of memory units 402 and 404. An address generator controller 420 controls the reading and writing into the memory, and the ordering thereof, and also controls the de-multiplexer 408 and selector 412.

Figure 5:
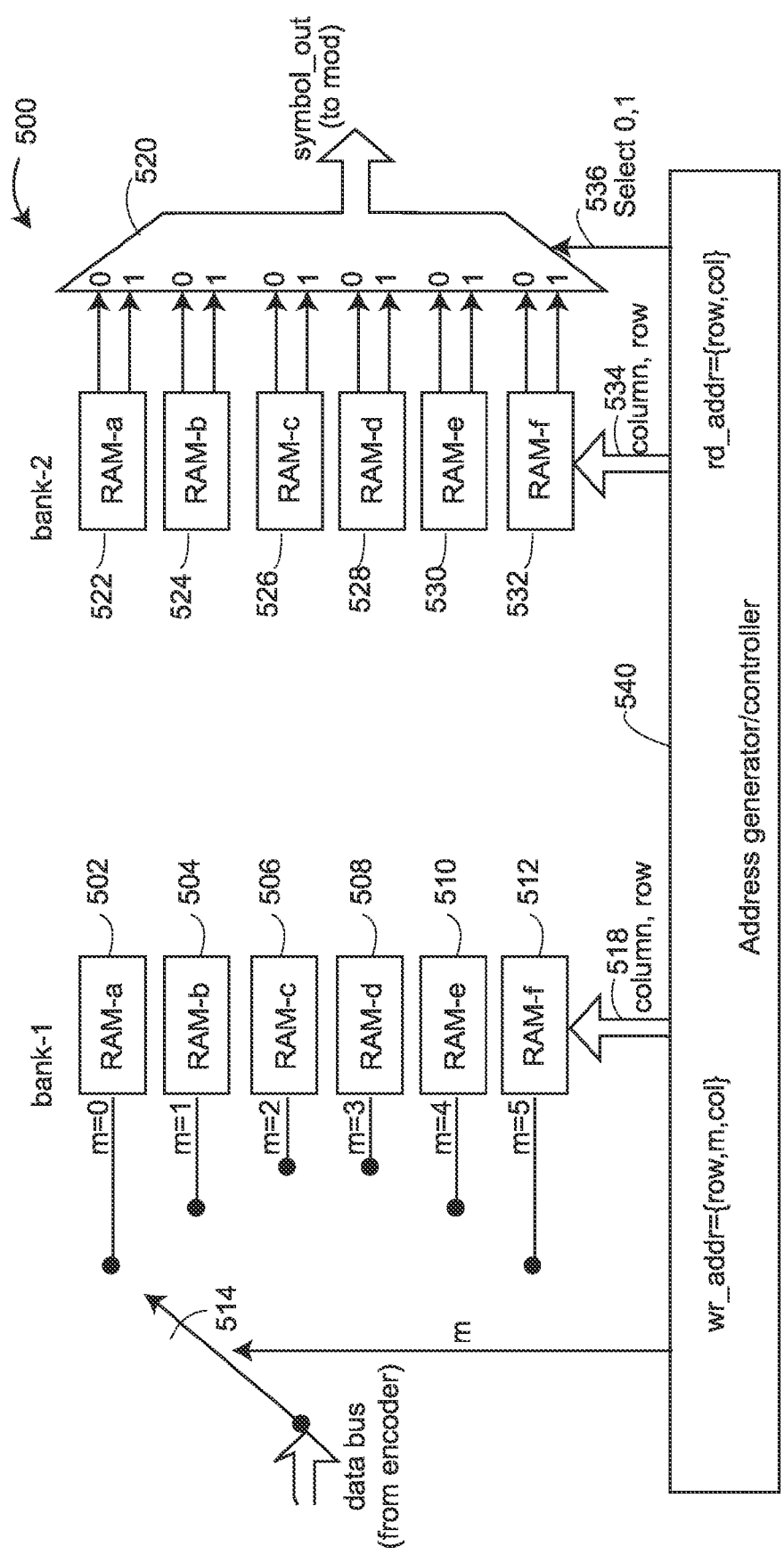
FIG. 5 is a functional block diagram of a first and a second memory bank that are each implemented with RAM modules.

The interleaver shown in FIG. 2 can also be modified to write two bits at a time into memory from an encoder that provides two bits at a time. That is, reading more than one bit at a time is a separate feature from having two memory arrays., FIG. 5 shows one interleaver embodiment 500 that describes in more detail how the memories for the bits of each symbol, i.e., that store the interleaver arrays, are mapped into RAM modules. In one interleaver embodiment, each RAM block contains six 2-bit wide RAMs labeled RAM-a to RAM-f. Thus, each RAM bank includes six 48-bit RAM's. The first memory bank (bank-1) includes six 2-bit RAMS 502 through 512 that are written into two bits at a time. Only one RAM is written to at a time according to the input signal (index m) to the de-multiplexer—shown as 514—from an address generator/controller 540. RAMs 522 though 532 form the other, already written to memory bank (bank-2) that is read out. In one embodiment, all six RAMS are read simultaneously, 12-bits at a time. The selector 520 selects which of the two bits of the six RAMs is output (538) at any time according to select bit 536.

While RAM bank-1 is being written, the other RAM bank-2 will be read, and vice versa. The number of bits written, and hence the number of RAMs used in the interleaver, depends on the modulation type and coding rate selected. For QAM64, all six RAM's are used. RAM selection is done with the address generation. When one of the banks is empty, the data is written into the RAM's with the address generated using a bit clock. Once it is completed, it will wait for the next empty bank. The interleaver writing should be faster than the reading. The data will be read from the interleaver as symbols whose width depends on the modulation type. The reading is done continuously at a fixed clock rate, e.g., 20-MHz.

The data is first written-in by columns. Then, for reading, the first column is selected, and the row address is incremented (0,1,2). Each time, only one bit is selected from the RAM output. Then the same column and row address is repeated, this time with the other bit being selected from the RAM output. The output symbols, for example, will be 0,16, 32,1,17,33.

The mapping of the interleaver arrays to the RAMs mapping is shown in Tables 8-13 for a set of IEEE 802.11a compatible modes. The write ordering is shown in Tables 8-12, and read ordering in Tables 13. Of course, in the case of a de-interleaver, the write and read orders are reversed.

From these tables, a designer can design the address generator shown as unit 540 in FIG. 5 to generate ordering of the column and row write addresses 518 and of the index m to determine the write order, and the column and row read addresses 534.

As can be seen from the tables, all six RAMs are used for 64QAM. 16QAM uses four RAMs, e.g., RAM-a-RAM-d; 8PSK uses three RAMs, e.g., RAM-a-RAM-c; QPSK uses two RAMs, e.g., RAM-a and RAM-b; and BPSK uses only one RAM, e.g., RAM-a.

In one embodiment, each RAM is a 128×2-bit array giving a maximum interleaver array size of 48 rows, i.e., 8 bit-groups, and 32 columns.

In order for data groups to be assigned to the correct sub-carrier, data must be presented to the inverse Fourier transformer (IFFT) subsection of the transmit part of a transceiver, e.g., unit 228 in bit reversed order. One aspect of the invention is that this re-ordering is done in the interleaver. Furthermore, this IFFT bit re-ordering is carried out as part of the read/write order of the memories. The numbers shown in brackets in Table 13 indicate the read order required for presenting the data in bit-reversed order to the IFFT block. One embodiment also allows for optional natural ordering (shown by the numbers not in brackets in Table 13).

Thus the writing into the memory and the reading out is in an order that performs the first block permutation and the re-ordering required by the IFFT to provide data in natural order.

Group Permutation

In addition to the block permutation (and to any bit order manipulation for the FFT/IFFT) carried out by the read/write order, in one embodiment, for some modulations schemes, e.g., for 64QAM and 16QAM, a second permutation is performed that operates on a number of bit-groups (i.e., subcarriers): six-bit groups of 6-bits for 64QAM, and groups of 4-bits for 16QAM. If this second permutation was not used, columns 0, 3, 6, 9, 12, and 15 of Table 8 (64QAM) and columns 0, 2, 4, 6, 8, and 10 of Tables 4 and 5 (16QAM) would hold the least significant bits (LSBs) of the code words that generate the I and Q components of the OFDM

TABLE 8

Interleaver array RAM mapping and write ordering for 64QAM

| addr | | wr col | 3 | 0 | | | | | | | | | | | | | | 1 | 1 | 3 | addr |
|---|---|---|---|---|---|---|---|---|---|---|---|---|---|---|---|---|---|---|---|---|---|
| | | | 2 | 0 | | | | | | | 1 | | | | | | | 0 | 1 | 2 | |
| 6 | 5 | | 1 | 0 | | | 1 | | | 0 | | | 1 | | | | | 0 | 1 | 1 | |
| 6 | 5 | 4 | 0 | 0 | | 1 | | 0 | | 1 | | 0 | | 1 | | 0 | | 1 | 0 | 0 | |
| wr_row | | | | 0 | | 1 | | 2 | | 3 | | 4 | | 5 | | 6 | | 7 | 8 | 15 | |
| 2 | 1 | 0 | i | 0 | 1 | 0 | 1 | 0 | 1 | 0 | 1 | 0 | 1 | 0 | 1 | 0 | 1 | 0 | 1 | 0 | 1 | |
| 0 | 0 | 0 | 0 | 0 | 1 | 2 | 3 | 4 | 5 | 6 | 7 | 8 | 9 | 10 | 11 | 12 | 13 | 14 | 15 | | a | RAM |
| | | | 1 | 16 | 17 | 18 | 19 | 20 | 21 | 22 | 23 | 24 | 25 | 26 | 27 | 28 | 29 | 30 | 31 | | b | |
| | | | 2 | 32 | 33 | 34 | 35 | 36 | 37 | 38 | 39 | 40 | 41 | 42 | 43 | 44 | 45 | 46 | 47 | | c | |
| | | | 3 | 48 | 49 | 50 | 51 | 52 | 53 | 54 | 55 | 56 | 57 | 58 | 59 | 60 | 61 | 62 | 63 | | d | |
| | | | 4 | 64 | 65 | 66 | 67 | 68 | 69 | 70 | 71 | 72 | 73 | 74 | 75 | 76 | 77 | 78 | 79 | | e | |
| | | | 5 | 80 | 81 | 82 | 83 | 84 | 85 | 86 | 87 | 88 | 89 | 90 | 91 | 92 | 93 | 94 | 95 | | f | |
| | 0 | 1 | 0 | 96 | 97 | 98 | 99 | 100 | 101 | 102 | 103 | 104 | 105 | 106 | 107 | 108 | 109 | 110 | 111 | | a | RAM |
| | | | 1 | 112 | 113 | 114 | 115 | 116 | 117 | 118 | 119 | 120 | 121 | 122 | 123 | 124 | 125 | 126 | 127 | | b | |
| | | | 2 | 128 | 129 | 130 | 131 | 132 | 133 | 134 | 135 | 136 | 137 | 138 | 139 | 140 | 141 | 142 | 143 | | c | |
| | | | 3 | 144 | 145 | 146 | 147 | 148 | 149 | 150 | 151 | 152 | 153 | 154 | 155 | 156 | 157 | 158 | 159 | | d | |
| | | | 4 | 160 | 161 | 162 | 163 | 164 | 165 | 166 | 167 | 168 | 169 | 170 | 171 | 172 | 173 | 174 | 175 | | e | |
| | | | 5 | 176 | 177 | 178 | 179 | 180 | 181 | 182 | 183 | 184 | 185 | 186 | 187 | 188 | 189 | 190 | 191 | | f | |
| | 1 | 0 | 0 | 192 | 193 | 194 | 195 | 196 | 197 | 198 | 199 | 200 | 201 | 202 | 203 | 204 | 205 | 206 | 207 | | a | RAM |
| | | 2 | 1 | 208 | 209 | 210 | 211 | 212 | 213 | 214 | 215 | 216 | 217 | 218 | 219 | 220 | 221 | 222 | 223 | | b | |
| | | | 2 | 224 | 225 | 226 | 227 | 228 | 229 | 230 | 231 | 232 | 233 | 234 | 235 | 236 | 237 | 238 | 239 | | c | |
| | | | 3 | 240 | 241 | 242 | 243 | 244 | 245 | 246 | 247 | 248 | 249 | 250 | 251 | 252 | 253 | 254 | 255 | | d | |
| | | | 4 | 256 | 257 | 258 | 259 | 260 | 261 | 262 | 263 | 264 | 265 | 266 | 267 | 268 | 269 | 270 | 271 | | e | |
| | | | 5 | 272 | 273 | 274 | 275 | 276 | 277 | 278 | 279 | 280 | 281 | 282 | 283 | 284 | 285 | 286 | 287 | | f | |
| | 1 | | 3 | | | | | | | | | | | | | | | | | | a | RAM |
| | | | | | | | | | | | | | | | | | | | | | b | |
| ... | ... | ... | ... | ... | ... | ... | ... | ... | ... | ... | ... | ... | ... | ... | ... | ... | ... | ... | ... | ... | ... | |
| 1 | 1 | 1 | 7 | | | | | | | | | | | | | | | | | | e | RAM |
| | | | | | | | | | | | | | | | | | | | | | f | |

TABLE 9

Interleaver array RAM mapping and write ordering for 16QAM

| addr | | wr col | 3 | 0 | | | | | | | | | | | | | | 1 | 1 | 3 | addr |
|---|---|---|---|---|---|---|---|---|---|---|---|---|---|---|---|---|---|---|---|---|---|
| | | | 2 | 0 | | | | | | | 1 | | | | | | | 0 | 1 | 2 | |
| | | | 1 | 0 | | | 1 | | | 0 | | | 1 | | | 0 | | 1 | 1 | | |
| 6 | 5 | 4 | 0 | 0 | | 1 | 0 | | 1 | 0 | | 1 | 0 | | 1 | 0 | | | 1 | 0 | |
| wr_row | | | | 0 | | 1 | 2 | | 3 | 4 | | 5 | 6 | | 7 | 8 | | | 15 | | |
| 2 | 1 | 0 | i | 0 | 1 | 0 | 1 | 0 | 1 | 0 | 1 | 0 | 1 | 0 | 1 | 0 | 1 | 0 | 1 | | |
| 0 | 0 | 0 | 0 | 0 | 1 | 2 | 3 | 4 | 5 | 6 | 7 | 8 | 9 | 10 | 11 | 12 | 13 | 14 | 15 | | a | |
| | | | 1 | 16 | 17 | 18 | 19 | 20 | 21 | 22 | 23 | 24 | 25 | 26 | 27 | 28 | 29 | 30 | 31 | | b | |
| | | | 2 | 32 | 33 | 34 | 35 | 36 | 37 | 38 | 39 | 40 | 41 | 42 | 43 | 44 | 45 | 46 | 47 | | c | RAM |
| | | | 3 | 48 | 49 | 50 | 51 | 52 | 53 | 54 | 55 | 56 | 57 | 58 | 59 | 60 | 61 | 62 | 63 | | d | |
| | | | | | | | | | | | | | | | | | | | | | e | |
| | | | | | | | | | | | | | | | | | | | | | f | |
| | 1 | 1 | 0 | 64 | 65 | 66 | 67 | 68 | 69 | 70 | 71 | 72 | 73 | 74 | 75 | 76 | 77 | 78 | 79 | | a | |
| | | | 1 | 80 | 81 | 82 | 83 | 84 | 85 | 86 | 87 | 88 | 89 | 90 | 91 | 92 | 93 | 94 | 95 | | b | |
| | | | 2 | 96 | 97 | 98 | 99 | 100 | 101 | 102 | 103 | 104 | 105 | 106 | 107 | 108 | 109 | 110 | 111 | | c | RAM |
| | | | 3 | 112 | 113 | 114 | 115 | 116 | 117 | 118 | 119 | 120 | 121 | 122 | 123 | 124 | 125 | 126 | 127 | | d | |
| | | | | | | | | | | | | | | | | | | | | | e | |
| | | | | | | | | | | | | | | | | | | | | | f | |
| 1 | 0 | 2 | 0 | 128 | 129 | 130 | 131 | 132 | 133 | 134 | 135 | 136 | 137 | 138 | 139 | 140 | 141 | 142 | 143 | | a | |
| | | | 1 | 144 | 145 | 146 | 147 | 148 | 149 | 150 | 151 | 152 | 153 | 154 | 155 | 156 | 157 | 158 | 159 | | b | |
| | | | 2 | 160 | 161 | 162 | 163 | 164 | 165 | 166 | 167 | 168 | 169 | 170 | 171 | 172 | 173 | 174 | 175 | | c | RAM |
| | | | 3 | 176 | 177 | 178 | 179 | 180 | 181 | 182 | 183 | 184 | 185 | 186 | 187 | 188 | 189 | 190 | 191 | | d | |
| | | | | | | | | | | | | | | | | | | | | | e | |
| | | | | | | | | | | | | | | | | | | | | | f | |
| | 1 | 3 | | | | | | | | | | | | | | | | | | | a | RAM |
| | | | | | | | | | | | | | | | | | | | | | b | |
| . | . | . | . | | | | | | | | | | | | | | | | | | . | |
| 1 | 1 | 1 | 7 | | | | | | | | | | | | | | | | | | e | RAM |
| | | | | | | | | | | | | | | | | | | | | | f | | symbol tones and therefore have the highest probability of being demodulated in error in the receiver. These low-reliability bits would occur in runs of 16 after demodulation, and might seriously impair the error correction performance of an included decoder of the receiver, e.g., an included Viterbi decoder. With the bit-group permutations, low-reliability bits are spread evenly throughout the demodulated data stream.

TABLE 10

Interleaver array RAM mapping and write ordering for 8PSK

| addr | | wr_col | 3 | 0 | | | | | | | | | | | | | | | 1 | 1 | 3 | addr |
|---|---|---|---|---|---|---|---|---|---|---|---|---|---|---|---|---|---|---|---|---|---|---|
| | | | 2 | 0 | | | | | | | 1 | | | | | | | | 0 | 1 | 2 | |
| 6 | 5 | 4 | 1 | 0 | | | 1 | | | 0 | | | 1 | | | 0 | | 1 | 1 | 1 | |
| | | | 0 | 0 | 1 | 0 | 1 | 0 | 1 | 0 | 1 | 0 | 1 | 0 | | | | | | | |
| wr_row | | | | 0 | 1 | 2 | 3 | 4 | 5 | 6 | 7 | 8 | 15 | | | | | | | | | |
| 2 | 1 | 0 | i | 0 | 1 | 0 | 1 | 0 | 1 | 0 | 1 | 0 | 1 | 0 | 1 | 0 | 1 | 0 | 1 | |
| 0 | 0 | 0 | 0 | 0 | 1 | 2 | 3 | 4 | 5 | 6 | 7 | 8 | 9 | 10 | 11 | 12 | 13 | 14 | 15 | | a | RAM |
| | | | 1 | 16 | 17 | 18 | 19 | 20 | 21 | 22 | 23 | 24 | 25 | 26 | 27 | 28 | 29 | 30 | 31 | | b | |
| | | | 2 | 32 | 33 | 34 | 35 | 36 | 37 | 38 | 39 | 40 | 41 | 42 | 43 | 44 | 45 | 46 | 47 | | c | |
| | | | | | | | | | | | | | | | | | | | | | d | |
| | | | | | | | | | | | | | | | | | | | | | e | |
| | | | | | | | | | | | | | | | | | | | | | f | |
| | 1 | 1 | 0 | 48 | 49 | 50 | 51 | 52 | 53 | 54 | 55 | 56 | 57 | 58 | 59 | 60 | 61 | 62 | 63 | | a | RAM |
| | | | 1 | 64 | 65 | 66 | 67 | 68 | 69 | 70 | 71 | 72 | 73 | 74 | 75 | 76 | 77 | 78 | 79 | | b | |
| | | | 2 | 80 | 81 | 82 | 83 | 84 | 85 | 86 | 87 | 88 | 89 | 90 | 91 | 92 | 93 | 94 | 95 | | c | |
| | | | | | | | | | | | | | | | | | | | | | d | |
| | | | | | | | | | | | | | | | | | | | | | e | |
| | | | | | | | | | | | | | | | | | | | | | f | |
| 1 | 0 | 2 | 0 | 96 | 97 | 98 | 99 | 100 | 101 | 102 | 103 | 104 | 105 | 106 | 107 | 108 | 109 | 110 | 111 | | a | RAM |
| | | | 1 | 112 | 113 | 114 | 115 | 116 | 117 | 118 | 119 | 120 | 121 | 122 | 123 | 124 | 125 | 126 | 127 | | b | |
| | | | 2 | 128 | 129 | 130 | 131 | 132 | 133 | 134 | 135 | 136 | 137 | 138 | 139 | 140 | 141 | 142 | 143 | | c | |
| | | | | | | | | | | | | | | | | | | | | | d | |
| | | | | | | | | | | | | | | | | | | | | | e | |
| | | | | | | | | | | | | | | | | | | | | | f | |
| | 1 | 3 | | | | | | | | | | | | | | | | | | | a | RAM |
| | | | | | | | | | | | | | | | | | | | | | b | |
| ... | ... | ... | ... | | | | | | | | | | | | | | | | | | | |
| 1 | 1 | 1 | 7 | | | | | | | | | | | | | | | | | | e | RAM |
| | | | | | | | | | | | | | | | | | | | | | f | |

TABLE 11

Interleaver array RAM mapping and write ordering for QPSK

| addr | | wr col | 3 | | | | | | | | 0 | | | | | | | | 1 | 1 | 3 | addr |
|---|---|---|---|---|---|---|---|---|---|---|---|---|---|---|---|---|---|---|---|---|---|---|
| | | | 2 | | | | 0 | | | | | | | | 1 | | | | 0 | 1 | 2 | |
| 6 | 5 | 4 | 1 | | 0 | | | 1 | | | 0 | | | | 1 | | | 0 | 1 | 1 | |
| | | | 0 | 0 | | 1 | 0 | | 1 | 0 | | 1 | 0 | | 1 | 0 | | 1 | 0 | 1 | 0 | |
| wr_row | | | | 0 | | 1 | | 2 | | 3 | | 4 | | 5 | | 6 | | 7 | 8 | 15 | | |
| 2 | 1 | 0 | i | 0 | 1 | 0 | 1 | 0 | 1 | 0 | 1 | 0 | 1 | 0 | 1 | 0 | 1 | 0 | 1 | 0 | 1 | |
| | | | 0 | 0 | 1 | 2 | 3 | 4 | 5 | 6 | 7 | 8 | 9 | 10 | 11 | 12 | 13 | 14 | 15 | | a | |
| | | | 1 | 16 | 17 | 18 | 19 | 20 | 21 | 22 | 23 | 24 | 25 | 26 | 27 | 28 | 29 | 30 | 31 | | b | RAM |
| | 0 | 0 | | | | | | | | | | | | | | | | | | | c | |
| | | | | | | | | | | | | | | | | | | | | | d | |
| | | | | | | | | | | | | | | | | | | | | | e | |
| 0 | | | | | | | | | | | | | | | | | | | | | f | |
| | | | 0 | 32 | 33 | 34 | 35 | 36 | 37 | 38 | 39 | 40 | 41 | 42 | 43 | 44 | 45 | 46 | 47 | | a | |
| | | | 1 | 48 | 49 | 50 | 51 | 52 | 53 | 54 | 55 | 56 | 57 | 58 | 59 | 60 | 61 | 62 | 63 | | b | RAM |
| | 1 | 1 | | | | | | | | | | | | | | | | | | | c | |
| 0 | | | | | | | | | | | | | | | | | | | | | d | |
| | | | | | | | | | | | | | | | | | | | | | e | |
| | | | | | | | | | | | | | | | | | | | | | f | |
| | | | 0 | 64 | 65 | 66 | 67 | 68 | 69 | 70 | 71 | 72 | 73 | 74 | 75 | 76 | 77 | 78 | 79 | | a | |
| | | | 1 | 80 | 81 | 82 | 83 | 84 | 85 | 86 | 87 | 88 | 89 | 90 | 91 | 92 | 93 | 94 | 95 | | b | RAM |
| | 0 | 2 | | | | | | | | | | | | | | | | | | | c | |
| 1 | | | | | | | | | | | | | | | | | | | | | d | |
| | | | | | | | | | | | | | | | | | | | | | e | |
| | | | | | | | | | | | | | | | | | | | | | f | |
| | 1 | 3 | | | | | | | | | | | | | | | | | | | a | RAM |
| | | | | | | | | | | | | | | | | | | | | | b | |
| ... | ... | ... | ... | ... | ... | ... | ... | ... | ... | ... | ... | ... | ... | ... | ... | ... | ... | ... | ... | ... | ... | |
| | | | | | | | | | | | | | | | | | | | | | e | RAM |
| | | | | | | | | | | | | | | | | | | | | | f | |

TABLE 12

Interleaver array RAM mapping and write ordering for BPSK

| addr | | wr_col | 3 | 0 | | | | | | | | 1 | 1 | 3 | addr |
|---|---|---|---|---|---|---|---|---|---|---|---|---|---|---|---|
| | | | 2 | 0 | | | | 1 | | | | 0 | 1 | 2 | |
| 6 5 4 | | | 1 | 0 | | 1 | | 0 | | 1 | | 0 | 1 | 1 | |
| | | | 0 | 0 | 1 | 0 | 1 | 0 | 1 | 0 | 1 | 0 | 1 | 0 | |
| wr_row | | | | 0 | 1 | 2 | 3 | 4 | 5 | 6 | 7 | 8 | 15 | | |
| 2 1 0 | | | i | 0 1 | 0 1 | 0 1 | 0 1 | 0 1 | 0 1 | 0 1 | 0 1 | 0 | 1 | | |
| 0 | 0 0 | | 0 | 0 1 | 2 3 | 4 5 | 6 7 | 8 9 | 10 11 | 12 13 | 14 15 | | a | RAM |
| | | | 1 | | | | | | | | | | b | |
| | | | 2 | | | | | | | | | | c | |
| | | | 3 | | | | | | | | | | d | |
| | | | 4 | | | | | | | | | | e | |
| | | | 5 | | | | | | | | | | f | |
| | 1 1 | | 0 | 16 17 | 18 19 | 20 21 | 22 23 | 24 25 | 26 27 | 28 29 | 30 31 | | a | RAM |
| | | | 1 | | | | | | | | | | b | |
| | | | 2 | | | | | | | | | | c | |
| | | | 3 | | | | | | | | | | d | |
| | | | 4 | | | | | | | | | | e | |
| | | | 5 | | | | | | | | | | f | |
| 1 | 0 2 | | 0 | 32 33 | 34 35 | 36 37 | 38 39 | 40 41 | 42 43 | 44 45 | 46 47 | | a | RAM |
| | | | 1 | | | | | | | | | | b | |
| | | | 2 | | | | | | | | | | c | |
| | | | 3 | | | | | | | | | | d | |
| | | | 4 | | | | | | | | | | e | |
| | | | 5 | | | | | | | | | | f | |
| | 1 3 | | 0 | | | | | | | | | | a | RAM |
| | | | 1 | | | | | | | | | | b | |
| ... | | | ... | | | | | | | | | | | | |
| | | | 4 | | | | | | | | | | e | RAM |
| | | | 5 | | | | | | | | | | f | |

TABLE 13

Interleaver array RAM mapping and read ordering for all modulation types

| addr 6 5 4 | rd col | addr 3 2 1 | rd_row 2 1 0 | | | | | | | | | | | | | | | | | | | | addr 1 1 1 0 | addr 1 3 2 1 | |
|---|---|---|---|---|---|---|---|---|---|---|---|---|---|---|---|---|---|---|---|---|---|---|---|---|
| | | 4 | | 0 | | | | | | | | | | | | | | | | | | 1 | 1 3 | |
| | | 3 | | 0 | | | | | | | 1 | | | | | | | | | | | 0 | 1 2 | |
| | | 2 | | 0 | | | | 1 | | | 0 | | | | 1 | | | | | | | 0 | 1 1 | |
| | | 1 | 0 | | 1 | | 0 | | 1 | | 0 | | 1 | | 0 | | 1 | | | | | 0 | 1 0 | |
| | | 0 | 0 | 1 | 0 | 1 | 0 | 1 | 0 | 1 | 0 | 1 | 0 | 1 | 0 | 1 | 0 | 1 | | | | | 0 | 1 | |
| | | | 0 | | 1 | | 2 | | 3 | | 4 | | 5 | | 6 | | 7 | | | | | 8 | 15 | |
| 0 | 0 | 0 | 0 | 3 | 6 | 9 | 12 | 15 | 18 | 21 | 24 | 27 | 30 | 33 | 36 | 39 | 42 | 45 | | | | | | a b c d e f | RAM |
| | | | (20) | (30) | (35) | (1) | (39) | (22) | (18) | (36) | (26) | (6) | (2) | (40) | (23) | (27) | (7) | (4) | | | | | | | |
| 0 | 1 | 1 | 1 | 4 | 7 | 10 | 13 | 16 | 19 | 22 | 25 | 28 | 31 | 34 | 37 | 40 | 43 | 46 | | | | | | a b c d e f | RAM |
| | | | (42) | (16) | (24) | (28) | (8) | (44) | (41) | (22) | (12) | (32) | (29) | (9) | (45) | (13) | (21) | (31) | | | | | | | |
| 1 | 0 | 2 | 2 | 5 | 8 | 11 | 14 | 17 | 20 | 23 | 26 | 29 | 32 | 35 | 38 | 41 | 44 | 47 | | | | | | a b c d e f | RAM |
| | | | (3) | (10) | (46) | (14) | (33) | (5) | (11) | (47) | (37) | (19) | (15) | (34) | (0) | (38) | (43) | (17) | | | | | | | |
| | 1 | 3 | | | | | | | | | | | | | | | | | | | | | | a b | RAM |
| | | | | | | | | | | | | | | | | | | | | | | | | e f | RAM |

Thus, in one embodiment, a second stage permutation can rotate the I-bits and the Q-bits separately (for I,Q) data by one bit position every three subcarriers.

In one embodiment, this second permutation is performed by physically transposing the bits which have been read out (in the case of an interleaver) or about to be written into (in the case of a de-interleaver) a multi-bit RAM. This second permutation is carried out by a separate permute unit 214 (FIG. 2) or 312 (FIG. 3) or 412 (FIG. 4). The operation is called a group permute herein, and the permuter unit is called a group permuter. The bit-group permutations are also sometimes called subcarrier permutation.

Table 14 and Table 15 show, for one embodiment, the effective array read ordering including the bit-group permutations. Each row of the array receives the same bit-group permutation. For 64QAM the bit-group permutations alternate row-by-row between three different permutations, one of which is straight through. For 16QAM the bit-group permutations alternate between two different permutations, one of which is straight through. These are illustrated in Table 16.

TABLE 14

64QAM: Interleaver Array Read Order, De-interleaver Array Write Order including bit-group permutations

|  | Column | | | | | | | | | | | | | | | | | |
|---|---|---|---|---|---|---|---|---|---|---|---|---|---|---|---|---|---|---|
| Row | 0 | 1 | 2 | 3 | 4 | 5 | 6 | 7 | 8 | 9 | 10 | 11 | 12 | 13 | 14 | 15 | 16 | 17 |
| 0 | 0 | 1 | 2 | 3 | 4 | 5 | 6 | 7 | 8 | 9 | 10 | 11 | 12 | 13 | 14 | 15 | 16 | 17 |
| 1 | 19 | 20 | 18 | 22 | 23 | 21 | 25 | 26 | 24 | 28 | 29 | 27 | 31 | 32 | 30 | 35 | 35 | 33 |
| 2 | 38 | 36 | 37 | 41 | 39 | 40 | 44 | 42 | 43 | 47 | 45 | 46 | 48 | 49 | 50 | 51 | 52 | 53 |
| 3 | 54 | 55 | 56 | 57 | 58 | 59 | 60 | 61 | 62 | 63 | 64 | 65 | 66 | 67 | 68 | 69 | 70 | 71 |
| 4 | 73 | 74 | 72 | 76 | 77 | 75 | 79 | 80 | 78 | 82 | 83 | 81 | 84 | 85 | 86 | 87 | 88 | 89 |
| 5 | 92 | 90 | 91 | 95 | 93 | 94 | 98 | 96 | 97 | 101 | 99 | 100 | 104 | 102 | 103 | 107 | 105 | 106 |
| 6 | 108 | 109 | 110 | 111 | 112 | 113 | 114 | 115 | 116 | 117 | 118 | 119 | 120 | 121 | 122 | 123 | 124 | 125 |
| 7 | 127 | 128 | 126 | 130 | 131 | 129 | 133 | 134 | 132 | 136 | 137 | 135 | 139 | 140 | 138 | 142 | 143 | 141 |
| 8 | 146 | 144 | 145 | 149 | 147 | 148 | 152 | 150 | 151 | 155 | 153 | 154 | 158 | 156 | 157 | 161 | 159 | 160 |
| 9 | 162 | 163 | 164 | 165 | 166 | 167 | 168 | 169 | 170 | 171 | 172 | 173 | 174 | 175 | 176 | 177 | 178 | 179 |
| 10 | 181 | 182 | 180 | 184 | 185 | 183 | 187 | 188 | 186 | 190 | 191 | 189 | 193 | 194 | 192 | 196 | 197 | 195 |
| 11 | 200 | 198 | 199 | 203 | 201 | 202 | 206 | 204 | 205 | 209 | 207 | 208 | 212 | 210 | 211 | 215 | 213 | 214 |
| 12 | 216 | 217 | 218 | 219 | 220 | 221 | 222 | 223 | 224 | 225 | 226 | 227 | 228 | 229 | 230 | 231 | 232 | 233 |
| 13 | 235 | 236 | 234 | 238 | 239 | 237 | 241 | 242 | 240 | 244 | 245 | 243 | 247 | 248 | 246 | 250 | 251 | 249 |
| 14 | 254 | 252 | 253 | 257 | 255 | 256 | 260 | 258 | 259 | 263 | 261 | 262 | 266 | 264 | 265 | 269 | 267 | 268 |
| 15 | 270 | 271 | 272 | 273 | 274 | 275 | 276 | 277 | 278 | 279 | 280 | 281 | 282 | 283 | 284 | 285 | 286 | 287 |
| | 0 | 1 | 2 | 3 | 4 | 5 | 0 | 1 | 2 | 3 | 4 | 5 | 0 | 1 | 2 | 3 | 4 | 5 |
| | 0 | | | | | | 1 | | | | | | 2 | | | | | |
| | Group | | | | | | | | | | | | | | | | | |

TABLE 15

16QAM: Block interleaver array write and read ordering for 16QAM Interleaver Array Read Order, De-interleaver Array Write Order

|  | Column | | | | | | | | | | | |
|---|---|---|---|---|---|---|---|---|---|---|---|---|
| Row | 0 | 1 | 2 | 3 | 4 | 5 | 6 | 7 | 8 | 9 | 10 | 11 |
| 0 | 0 | 1 | 2 | 3 | 4 | 5 | 6 | 7 | 8 | 9 | 10 | 11 |
| 1 | 13 | 12 | 15 | 14 | 17 | 16 | 19 | 18 | 21 | 20 | 23 | 22 |
| 2 | 24 | 25 | 26 | 27 | 28 | 29 | 30 | 31 | 32 | 33 | 34 | 35 |
| 3 | 37 | 36 | 39 | 38 | 41 | 40 | 43 | 42 | 45 | 44 | 47 | 46 |
| 4 | 48 | 49 | 50 | 51 | 52 | 53 | 54 | 55 | 56 | 57 | 58 | 59 |
| 5 | 61 | 60 | 63 | 62 | 65 | 64 | 67 | 66 | 69 | 68 | 71 | 70 |
| 6 | 72 | 73 | 74 | 75 | 76 | 77 | 78 | 79 | 80 | 81 | 82 | 83 |
| 7 | 85 | 84 | 87 | 86 | 89 | 88 | 91 | 90 | 93 | 92 | 95 | 94 |
| 8 | 96 | 97 | 98 | 99 | 100 | 101 | 102 | 103 | 104 | 105 | 106 | 107 |
| 9 | 109 | 108 | 111 | 110 | 113 | 112 | 115 | 114 | 117 | 116 | 119 | 118 |
| 10 | 120 | 121 | 122 | 123 | 124 | 125 | 126 | 127 | 128 | 129 | 130 | 131 |
| 11 | 133 | 132 | 135 | 134 | 137 | 136 | 139 | 138 | 141 | 140 | 143 | 142 |
| 12 | 144 | 145 | 146 | 147 | 148 | 149 | 150 | 151 | 152 | 153 | 154 | 155 |
| 13 | 157 | 156 | 159 | 158 | 161 | 160 | 163 | 162 | 165 | 164 | 167 | 166 |
| 14 | 168 | 169 | 170 | 171 | 172 | 173 | 174 | 175 | 176 | 177 | 178 | 179 |
| 15 | 181 | 180 | 183 | 182 | 185 | 184 | 187 | 186 | 189 | 188 | 191 | 190 |
| | 0 | 1 | 2 | 3 | 0 | 1 | 2 | 3 | 0 | 1 | 2 | 3 |
| | 0 | | | | 1 | | | | 2 | | | |
| | Group | | | | | | | | | | | |

TABLE 16

64QAM and 16QAM Interleaver and De-Interleaver Bit-Group Permutation Read and Write Ordering Interleaver Read Order 0
De-interleaver Write Order 0

| 0 | 1 | 2 | 3 | 4 | 5 |
|---|---|---|---|---|---|

Interleaver Read Order 1
De-interleaver Write Order 1

| 1 | 2 | 0 | 4 | 5 | 3 |
|---|---|---|---|---|---|

Interleaver Read Order 2
De-interleaver Write Order 2

| 2 | 1 | 0 | 5 | 3 | 4 |
|---|---|---|---|---|---|
| 0 | 1 | 2 | 3 | 4 | 5 |

Group Bit #

64QAM

Interleaver Read Order 0
De-interleaver Write Order 0

| 0 | 1 | 2 | 3 |
|---|---|---|---|

Interleaver Read Order 1
De-interleaver Write Order 1

| 1 | 0 | 3 | 2 |
|---|---|---|---|
| 1 | 2 | 3 | 4 |

Group Bit #

16QAM

Thus interleaving includes a first group permutation that is implemented by the write and read order of the memory or memories, a second group permutation required for some modulation schemes, and a separate bit-reversal/tone-mapping operation that is required for the FFT or IFFT. The bit reversal/tone mapping operation may also be applied on the basis of the write and read order, and can be combined with the write/read ordering of the group permutation, without affecting the group permutation. Such separation of the bit and the sub-carrier permutations allows the construction of a parallel memory interleaver suitable for commercial products and such an embodiment is described further below.

As an example, for BPSK, if the input bit sequence is:
   0,1,2,3,4,5,6,7,8,9, . . . ,44,45,46 and 47, then the output of the interleaver should have the sequence:
   0,16,32,1,17,33,2,18,34,3,19,35, . . . ,14,30,46,15,31,47.

The way data is organized within a typical RAM in this case is represented by Table 17,

TABLE 17

| COLUMNS | | | | | | | | ROWS | |
|---|---|---|---|---|---|---|---|---|---|
| 7 | 6 | 5 | 4 | 3 | 2 | 1 | 0 | | |
| 14 | 12 | 10 | 8 | 6 | 4 | 2 | 0 | 0 | |
| 15 | 13 | 11 | 9 | 7 | 5 | 3 | 1 | | |
| 30 | 28 | 26 | 24 | 22 | 20 | 18 | 16 | 1 | |
| 31 | 29 | 27 | 25 | 23 | 21 | 19 | 17 | | |
| 46 | 44 | 42 | 40 | 38 | 36 | 34 | 32 | 2 | |
| 47 | 45 | 43 | 41 | 39 | 37 | 35 | 33 | | |

The De-Interleaver

The design of a de-interleaver follows the reverse of that of an interleaver, and in particular, a similar double buffer structure may be used. One issue that the designer needs to address is that the de-interleaver may need to operate according to a different tone mapping, depending, for example, where that operation is performed in the receive chain. Furthermore, the de-interleaver output is typically fed to a decoder, which is one embodiment is a soft decision Viterbi decoder that provides several "soft" bits for each data bit, whereas in the interleaver, the encoder produces one data bit, albeit possibly two at a time. Thus the memory is typically larger in a de-interleaver.

Figure 6:
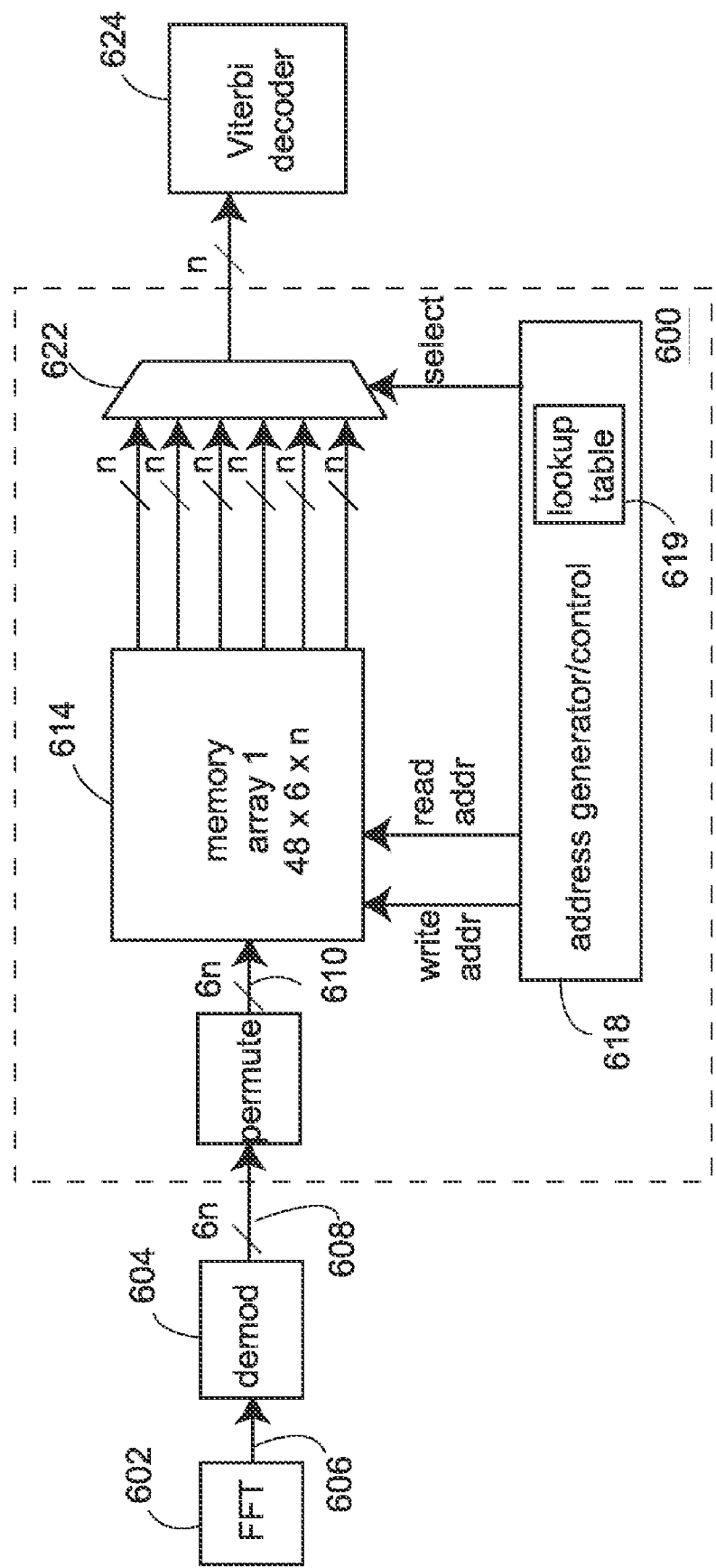
FIG. 6 is a functional block diagram of a de-interleaver that includes a single memory block into which data is written and read.

FIG. 6 shows one embodiment of a de-interleaver 600 that produces the soft bits of one data bit at a time. The received OFDM frame is translated to the frequency domain samples 606 by a 64-point FFT unit 602. These samples 606 are demodulated in demodulator 604 to subcarriers 608, which correspond to the output of the interleaver in the transmitter. The de-interleaver 600 will reverse the interleaver operation. Each subcarrier (i.e., each group) contains (n $N_{BPSC}$) soft bits, which represent $N_{BPSC}$ data bits. Thus 'n' soft bits represent 1 data bit, and is the number of soft bits, required as an input to the Viterbi decoder shown as unit 624 in FIG. 6.

De-interleaver 600 includes a memory array 614. Each subcarrier 610 (6n bits in compatible mode) is written into a single memory location, and while reading, the required n soft bits are selected using a multiplexer 622. Address generator/controller 618 derives the de-interleaver's write address from a lookup table, such as the Tables 8-13 above. As done for the interleaver's read address, the de-interleaver's write address is derived in address generator 618 from a lookup table 619.

A single bit output (reverse of single bit interleaver) could be obtained from a de-interleaver by writing the data into a single (48×6×n) memory and reading 6×n bits before selecting the appropriate n soft bits.

It is also possible to obtain the 2 n soft bits, i.e., two data-bits at a time from a single RAM using serial to parallel conversion with the penalty of higher memory bandwidth.

Figure 7:
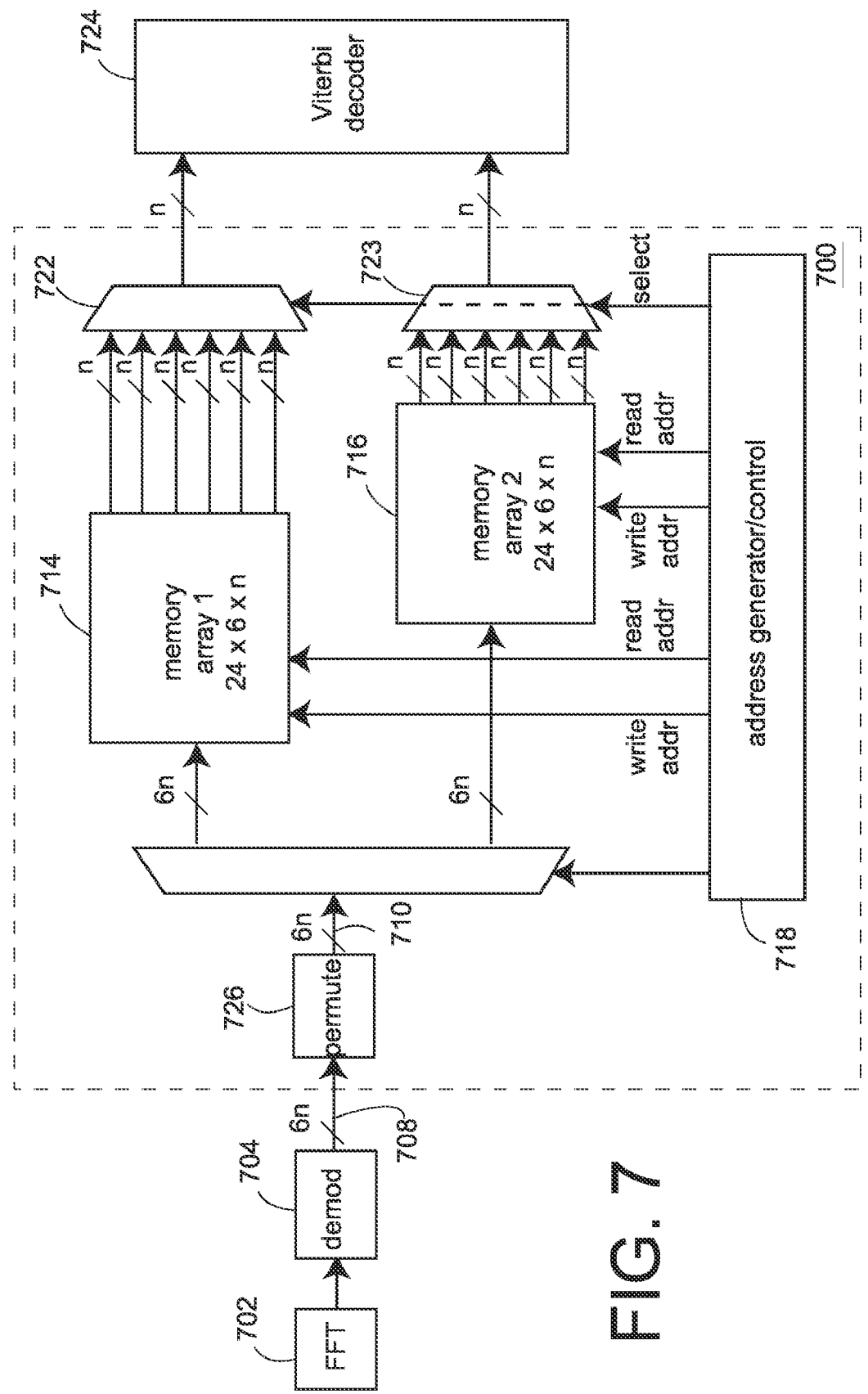
FIG. 7 is a functional block diagram of a de-interleaver that includes two memory blocks and that provides a decoder more than one, e.g., two data-bits' worth of soft bits at a time.

FIG. 7 shows a two-memory parallel de-interleaver embodiment 700 that also produces two data-bits' worth of soft bits at a time, and thus carries out the reverse of the operations of the interleaver embodiment of FIG. 4. The input data 708 is provided from the FFT unit 702 and demodulator 704. A bit permute operation may be necessary for some modulations, and is carried out by group permute unit 726. The data 710 is written into two memories 714 and 716, respectively, that are each 24×6×n bits for compatible mode. The memories 714 and 716 are both read simultaneously via selectors 722 and 723 to produce 2n bits for a Viterbi decoder 724 that accepts the soft bits for two data bits, i.e., 2n-bits. The selectors each select the appropriate n soft bits. The reading and writing of the two memories is carried out under control of an address generator/controller 718.

In the above embodiments, the inventors found that static RAM (SRAM) is suitable for implementing the memories.

While the above describes implementations suitable for the IEEE 802.11a compatible data-rates and modulation schemes, the invention is not restricted to these data rates and schemes, and can readily be adapted for other data rates and modulations, whether defined in a standard or not. Furthermore, while IEEE 802.1 a is one standard that uses coded OFDM, many other applications use OFDM, such as the Hiperlan II wireless LAN standard, the European Technical Standards Institute (ETSI) broadband radio access network (BRAN) standard, other satellite radio standards, digital television, and other wireless data network applications. The embodiments described herein may be readily modified for such other applications.

Furthermore, while the embodiments described herein assume an inverse discrete Fourier transform in the transmitter and a forward discrete Fourier transform in the receiver, those skilled in the art will recognize that the forward and reverse tranforms are similar in structure, and a transmitter may be implemented with a forward transform and similarly, a receiver with an inverse transform. In general the term discrete Fourier transform will cover either the forward or inverse transform as appropriate.

Thus, although particular embodiments of the present invention have been described and illustrated, such is not intended to limit the invention. Modifications and changes will no doubt become apparent to those skilled in the art, and it is intended that the invention include such modifications and changes.

What is claimed is:

1. An interleaver for performing a block permutation and, for one or more particular modulation schemes, a group permutation corresponding to the particular modulation scheme, the interleaver comprising:

a first stage for accepting the coded symbol bits of data for transmission by an OFDM modulator, the first stage including a memory accepting the coded symbols and arranged to write the coded symbols in a first part of the memory in a first order and simultaneously read coded symbols from a written-to second part of the memory in a second order to effectuate an interleaving operation; and a bit order permuter accepting the data read out of the first stage and in the case of one of the particular modulation schemes, permuting bits assignment to produce subcarrier data for input to an OFDM modulator, the permuter effectuating the group permutation corresponding to the particular modulation scheme, such that the first stage performs the block permutation and in the case of one of the particular modulation schemes, the bit order permuter performs the group permutation corresponding to the particular modulation scheme, such that the interleaver performs both an interleaving operation in the first stage to map adjacent coded bits to non-adjacent sub-carriers, in the case of one of the one or more particular modulation schemes, a re-ordering in the bit order permuter of the assignment of bits according to the particular modulation scheme.

2. An interleaver as recited in claim 1, wherein the first order of writing and the second order of reading the memory further perform re-ordering of the data such that an inverse discrete Fourier transform operation on the data output by the interleaver and modulated produces inverse transformed data in natural order.

3. An interleaver as recited in claim 1, wherein the memory includes at least one block of data, each block corresponding to a coded input data symbol, the data in each block arrangeable as an array, such that data bits are written column by column of the array and are read out row by row.

4. A de-interleaver for performing a group permutation for corresponding to any one of one or more particular modulation schemes and a block permutation for all modulation schemes, the de-interleaver comprising:

a bit order permuter accepting received sub-carrier data from an OFDM de-modulator and in the case of any one of the particular modulation schemes, permuting bits assignment to produce permuted sub-carrier data, the permuter effectuating the group permutation corresponding to the particular modulation scheme;

a second stage for accepting the permuted sub-carrier data, the second stage including a memory accepting the permuted sub-carrier data and arranged to write the permuted sub-carrier data in a first order in a first part of the memory and simultaneously read from a written-to second part of the memory in a second order to effectuate a de-interleaving operation, the read out data providing input data for a decoder, such that the second stage performs the block permutation and the bit order mapper performs any required group permutation, such that the de-interleaver is operative to de-interleave data that has been interleaved, the interleaving of data including mapping adjacent coded bits to non-adjacent sub-carriers, and in the case of any one of the one or more particular modulation schemes, re-ordering of the assignment of bits, the re-ordering according to the particular modulation scheme.

5. A de-interleaver as recited in claim 4, wherein the first order of writing and the second order of reading the memory further perform re-ordering of the data order such that the ordering of the sub-carrier data resulting from a discrete Fourier transform operation used to produce the sub-carrier data is modified such the data output by the de-interleaver produces data in natural order.

6. A de-interleaver for performing a block permutation on sub-carrier data received from an OFDM receiver and for producing a complete block of coded bits that correspond to a received OFDM symbol, the de-interleaver comprising a memory array, wherein performing the block permutation includes writing input data into a first part of the memory and simultaneously reading previously written data out of a second part of the memory in a different order, wherein the writing input data is in a first order and the reading is in a, second order the first order of writing and the second order of reading including re-ordering of the data order such that the ordering of the sub-carrier data resulting from a discrete Fourier transform operation used to produce the sub-carrier data is modified such that the de-interleaver produces data in natural order.

7. An interleaving method comprising the steps of:
accepting a block of coded data;
writing the block of coded data into a first part of a memory in a first order;
simultaneously reading a previously written block of coded data from a second part of the memory in a second order to provide data in sub-carrier form; and
wherein the first read order and the second write order effectuate a block permutation to interleave coded bits, and for any one of a set of one or more particular modulation schemes, permuting the bit-order of the data read out of the memory to effectuate a group permutation for the particular modulation scheme.

8. An interleaving method as recited in claim 7, wherein the first block permutation maps adjacent coded bits to non-adjacent subcarriers in orthogonal frequency division multiplexing (OFDM).

9. A method as recited in claim 7, wherein the first order of writing and the second order of reading the memory further perform re-ordering of the data such that an inverse discrete Fourier transform operation on the data produced by the interleaving method for modulation produces inverse transformed data in natural order.

10. A method as recited in claim 7, wherein the memory includes at least one block of data, each block corresponding to a coded input data symbol, the data in each block arrangeable as an array, such that data bits are written column by column of the array and are read out row by row.

11. An interleaver comprising:
means for accepting a block of coded data;
means for writing the block of coded data into a first part of a memory in a first order;
means for reading a previously-written block of coded data from a second part of the memory in a second order to provide data in sub-carrier form; and
means for bit order permuting the data read out of the memory,
wherein the first read order and the second write order effectuate a first block permutation to interleave coded bits, and wherein the bit order permuting effectuates a second group permutation for any one of one or more particular modulation schemes.

12. An interleaver as recited in claim 11, wherein the first order of writing and the second order of reading the memory further effectuate re-ordering of the data such that an inverse discrete Fourier transform operation on the data produced by the interleaving method for modulation produces discrete transformed data in natural order.

13. An interleaver as recited in claim 11, wherein the memory includes at least one block of data, each block corresponding to a coded input data symbol, the data in each block arrangeable as an array, such that data bits are written column by column of the array and are read out row by row.

14. A de-interleaving method comprising the steps of:
accepting a block of sub-carrier data;
bit order permuting the data to effectuate a group permutation of the de-interleaving method for particular modulation schemes;
writing the block of permuted data into a first part of a memory in a first order; and simultaneously reading a previously-written block of coded data from written-to second part of the memory in a second order to provide coded bits, wherein the first read order and the second write order effectuate a second block permutation of the de-interleaving method, that the de-interleaving is operative to de-interleave data that has been interleaved by an interleaving method that includes including mapping adjacent coded bits to non-adjacent sub-carriers, and in the case of any one of the one or more particular modulation schemes, re-ordering of the assignment of bits, the re-ordering according to the particular modulation scheme.

15. A method as recited in claim 14, wherein the first order of writing and the second order of reading the memory further perform re-ordering of the data such that a discrete Fourier transform operation on the data accepted by the de-interleaving method produces data out of the de-interleaving method in natural order.

* * * * *

UNITED STATES PATENT AND TRADEMARK OFFICE
CERTIFICATE OF CORRECTION

PATENT NO. : 7,430,215 B2  
APPLICATION NO. : 11/470383  
DATED : September 30, 2008  
INVENTOR(S) : Arivoli et al.

It is certified that error appears in the above-identified patent and that said Letters Patent is hereby corrected as shown below:

In col. 30, line 28, kindly change "IEEE 802.1 a" to -- IEEE 802.11a --.

Signed and Sealed this

Third Day of February, 2009

JOHN DOLL  
*Acting Director of the United States Patent and Trademark Office*